United States Patent
Yim et al.

(10) Patent No.: US 10,566,433 B2
(45) Date of Patent: Feb. 18, 2020

(54) SEMICONDUCTOR DEVICES HAVING TRANSISTORS WITH DIFFERENT WORK FUNCTION LAYERS

(71) Applicant: Samsung Electronics Co., Ltd., Suwon-si, Gyeonggi-do (KR)

(72) Inventors: Jeong-Hyuk Yim, Seoul (KR); Wan-Don Kim, Seongnam-si (KR); Jong-Han Lee, Namyangju-si (KR); Hyung-Suk Jung, Suwon-si (KR); Sang-Jin Hyun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/030,291

(22) Filed: Jul. 9, 2018

(65) Prior Publication Data
US 2019/0157410 A1 May 23, 2019

(30) Foreign Application Priority Data
Nov. 23, 2017 (KR) .................. 10-2017-0157504

(51) Int. Cl.
| | | |
|---|---|---|
| *H01L 29/423* | (2006.01) | |
| *H01L 21/8234* | (2006.01) | |
| *H01L 27/088* | (2006.01) | |
| *H01L 21/8238* | (2006.01) | |
| *H01L 29/66* | (2006.01) | |
| *H01L 27/092* | (2006.01) | |

(52) U.S. Cl.
CPC .. *H01L 29/42376* (2013.01); *H01L 21/82385* (2013.01); *H01L 21/823456* (2013.01); *H01L 21/823842* (2013.01); *H01L 27/0886* (2013.01); *H01L 27/0922* (2013.01); *H01L 29/66545* (2013.01); *H01L 21/82345* (2013.01); *H01L 27/088* (2013.01)

(58) Field of Classification Search
CPC ....... H01L 29/42376; H01L 21/823456; H01L 27/0886; H01L 29/66545; H01L 21/82385
See application file for complete search history.

(56) References Cited

U.S. PATENT DOCUMENTS 8,940,626 B2   1/2015   Xie et al.
9,373,690 B2   6/2016   Chudzik et al.
(Continued)

FOREIGN PATENT DOCUMENTS

KR   10-2013-0123158   11/2013

*Primary Examiner* — Feifei Yeung Lopez
(74) *Attorney, Agent, or Firm* — Muir Patent Law, PLLC

(57) ABSTRACT

A semiconductor device includes a substrate having a first region and a second region, a first transistor formed in the first region and formed by a first gate line including a first lower metal-containing layer and a first upper metal-containing layer, and a second transistor formed in the second region and formed by a second gate line having an equal width to that of the first gate line and including a second lower metal-containing layer and a second upper metal-containing layer on the second upper metal-containing layer, wherein each of an uppermost end of the first upper metal-containing layer and an uppermost end of the second lower metal-containing layer has a higher level than an uppermost end of the first lower metal-containing layer.

14 Claims, 14 Drawing Sheets

(56) References Cited

U.S. PATENT DOCUMENTS

| | | |
|---|---|---|
| 9,425,103 B2 | 8/2016 | Xie et al. |
| 9,530,778 B1 | 12/2016 | Lin et al. |
| 9,583,485 B2 | 2/2017 | Chang et al. |
| 9,589,850 B1 | 3/2017 | Park et al. |
| 2003/0003666 A1* | 1/2003 | Iriyama ............. H01L 21/76895 |
| | | 438/275 |
| 2007/0215950 A1* | 9/2007 | Aoyama ......... H01L 21/823842 |
| | | 257/369 |
| 2011/0309451 A1* | 12/2011 | Tsukamoto ....... H01L 21/28114 |
| | | 257/369 |
| 2013/0295758 A1 | 11/2013 | Kim |
| 2016/0064378 A1 | 3/2016 | Kwon et al. |
| 2016/0225868 A1 | 8/2016 | Kim et al. |
| 2016/0240630 A1* | 8/2016 | Seong ................ H01L 29/66545 |
| 2018/0261456 A1* | 9/2018 | Yang ................. H01L 21/32139 |

\* cited by examiner

SEMICONDUCTOR DEVICES HAVING TRANSISTORS WITH DIFFERENT WORK FUNCTION LAYERS

CROSS-REFERENCE TO RELATED APPLICATION

This application claims the benefit of Korean Patent Application No. 10-2017-0157504, filed on Nov. 23, 2017, in the Korean Intellectual Property Office, the disclosure of which is incorporated herein in its entirety by reference.

BACKGROUND

The inventive concept relates to semiconductor devices, and more particularly, to a semiconductor device including transistors.

BACKGROUND

Semiconductor devices used in electronic devices may need to provide transistors that operate at various levels even when those devices are scaled down.

SUMMARY

The inventive concept provides a semiconductor device that may be down-scaled and include transistors capable of providing various operating voltages.

According to an aspect of the inventive concept, there is provided a semiconductor device including: a substrate having a first region and a second region; a first transistor formed in the first region and including a first gate line including a first lower metal-containing layer and a first upper metal-containing layer; and a second transistor formed in the second region and including a second gate line having a same width as that of the first gate line and including a second lower metal-containing layer and a second upper metal-containing layer on the second upper metal-containing layer, wherein each of an uppermost end of the first upper metal-containing layer and an uppermost end of the second lower metal-containing layer has a higher level than an uppermost end of the first lower metal-containing layer.

According to another aspect of the inventive concept, there is provided a semiconductor device including: a substrate having a first region, a second region, and a third region; a first transistor formed in the first region and including a first gate line including a first lower metal-containing layer and a first upper metal-containing layer on the first lower metal-containing layer; a second transistor formed in the second region and including a second gate line including a second lower metal-containing layer and a second upper metal-containing layer on the second lower metal-containing layer, the second gate line having a same width as the first gate line; and a third transistor formed in the third region and formed by a third gate line including a third lower metal-containing layer and a third upper metal-containing layer on the third lower metal-containing layer, the third gate line having a greater width than the second gate line, wherein an uppermost end of the first upper metal-containing layer, an uppermost end of the second lower metal-containing layer, and an uppermost end of the third lower metal-containing layer each have a higher level than an uppermost end of the first lower metal-containing layer.

According to another aspect of the inventive concept, there is provided a semiconductor device including: a substrate having a first region and a second region; a first transistor formed in the first region and formed by a first gate line including a first lower metal-containing layer and a first upper metal-containing layer on the first upper metal-containing layer; and a second transistor formed in the second region and formed by a second gate line including a second lower metal-containing layer and having a same width as the first gate line, wherein the first and second lower metal-containing layers are formed of a material having a smaller work function than the first upper metal-containing layer, wherein an uppermost end of the first upper metal-containing layer and an uppermost end of the second lower metal-containing layer each have a higher level than an uppermost end of the first lower metal-containing layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Expressions such as "at least one of," when preceding a list of elements, modify the entire list of elements and do not modify the individual elements of the list. It will be understood that the recitation of a value herein (such as a value of a particular operating voltage or threshold voltage of a transistor) also includes values that are about equal to the recited value.

Figure 1:
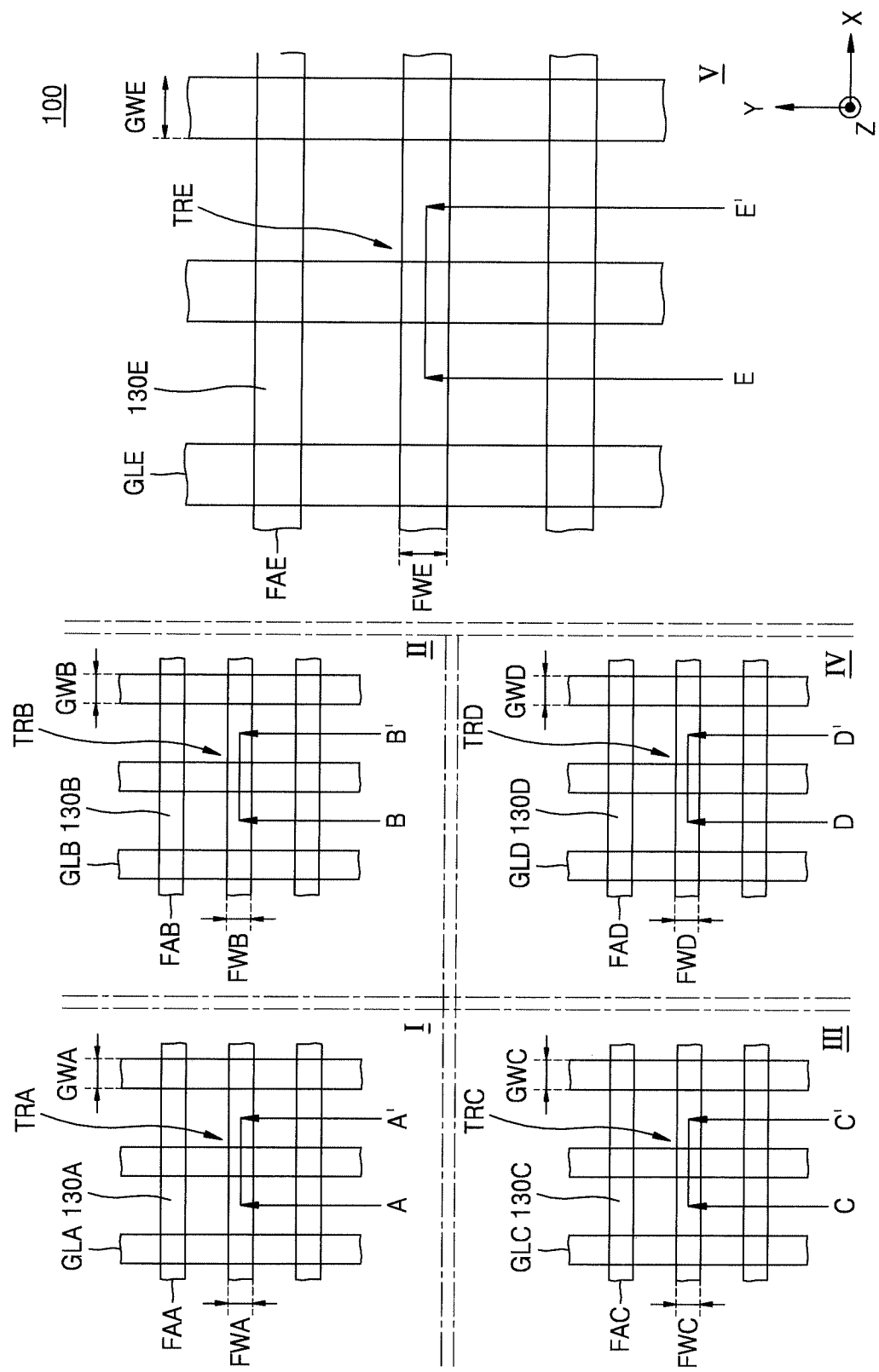
FIG. 1 is a planar layout diagram illustrating elements of a semiconductor device according to embodiments of the inventive concept.

FIG. 1 is a planar layout diagram illustrating elements of a semiconductor device 100 according to embodiments of the inventive concept.

Referring to FIG. 1, the semiconductor device 100 may include a first region I, a second region II, a third region III, a fourth region IV, and a fifth region V. In some embodiments, the semiconductor device 100 may not include at least one of the first region I, the second region II, and the third region III.

A first transistor TRA, a second transistor TRB, a third transistor TRC, a fourth transistor TRD, and a fifth transistor TRE may be disposed in the first region I, the second region II, the third region III, the fourth region IV, and the fifth region V, respectively.

The first region I includes a plurality of first fin-type active regions FAA extending in parallel with each other in a first direction (X direction) and a plurality of first gate lines GLA extending in a second direction (Y direction) and intersecting the plurality of fin-type active regions FAA over the plurality of first fin-type active regions FAA. The first transistor TRA may be formed at each of portions where the plurality of first fin-type active regions FAA and the plurality of first gate lines GLA intersect each other. The plurality of first fin-type active regions FAA may have a first fin width FWA, and the first gate lines GLA may have a first gate width GWA.

The second region II includes a plurality of second fin-type active regions FAB extending in parallel with each other in the first direction (X direction) and a plurality of second gate lines GLB extending in the second direction (Y direction) intersecting with the plurality of second fin-type active region FAB over the plurality of second fin-type active regions FAB. The second transistor TRB may be formed at each of portions where the plurality of second fin-type active regions FAB and the plurality of second gate lines GLB intersect each other. The plurality of second fin-type active regions FAB may have a second fin width FWB, and the second gate lines GLB may have a second gate width GWB.

The third region III includes a plurality of third fin-type active regions FAC extending in parallel with each other in the first direction (X direction) and a plurality of third gate lines GLC extending in the second direction (Y direction) intersecting with the plurality of third fin-type active region FAC over the plurality of third fin-type active regions FAC. The third transistor TRB may be formed at each of portions where the plurality of third fin-type active regions FAC and the plurality of third gate lines GLC intersect each other. The plurality of third fin-type active regions FAC may have a third fin width FWC, and the third gate lines GLC may have a third gate width GWC.

The fourth region IV includes a plurality of fourth fin-type active regions FAD extending in parallel with each other in the first direction (X direction) and a plurality of fourth gate lines GLD extending in the fourth direction (Y direction) intersecting with the plurality of fourth fin-type active region FAD over the plurality of fourth fin-type active regions FAD. The fourth transistor TRD may be formed at each of portions where the plurality of fourth fin-type active regions FAD and the plurality of fourth gate lines GLD intersect each other. The plurality of fourth fin-type active regions FAB may have a fourth fin width FWB, and the fourth gate lines GLD may have a fourth gate width GWD.

The fifth region V includes a plurality of fifth fin-type active regions FAE extending in parallel with each other in the first direction (X direction) and a plurality of fifth gate lines GLE extending in the fifth direction (Y direction) and intersecting with the plurality of fifth fin-type active region FAE over the plurality of fifth fin-type active regions FAE. The fifth transistor TRE may be formed at each of portions where the plurality of fifth fin-type active regions FAE and the plurality of fifth gate lines GLE intersect each other. The plurality of fifth fin-type active regions FAE may have a fifth fin width FWE, and the fifth gate lines GLE may have a fifth gate width GWE.

The first through fourth fin widths FWA, FWB, FWC, and FWD may be less than the fifth fin width FWE, and the first through fourth gate widths GWA, GWB, GWC, and GWD may be less than the fifth gate width GWE. In some embodiments, the first through fourth fin widths FWA, FWB, FWC, and FWD may be equal to each other, and the first through fourth gate widths GWA, GWB, GWC, and GWD may be equal to each other.

The first transistor TRA and the second transistor TRB may be a first conductivity-type metal oxide semiconductor field effect transistor (MOSFET), and the third transistor TRC and the fourth transistor TRD may be a second conductivity-type MOSFET.

The first transistor TRA and the second transistor TRB may be an n-type MOSFET, and the third transistor TRC and the fourth transistor TRD may be a p-type MOSFET. In some embodiments, the fifth transistor TRE may be an n-type MOSFET.

An operating voltage of the first transistor TRA may be less than an operating voltage of the second transistor TRB, and an operating voltage of the third transistor TRC may be less than an operating voltage of the fourth transistor TRD. The operating voltages of the first through fourth transistors TRA, TRB, TRC, and TRD may be less than an operating voltage of the fifth transistor TRE. Magnitudes of the operating voltages of the first through fifth transistors TRA, TRB, TRC, TRD, and TRE may be compared via absolute values of the operating voltages of the first through fifth transistors TRA, TRB, TRC, TRD, and TRE.

While FIG. 1 illustrates that the plurality of first through fifth fin-type active regions FAA, FAB, FAC, FAD, and FAE extend in the first direction (X direction), and the plurality of first through fifth gate lines GLA, GLB, GLC, GLD, and GLE extend in the second direction (Y-direction), the inventive concept is not limited to the example illustrated in FIG. 1, and the plurality of first through fifth fin-type active regions FAA, FAB, FAC, FAD, and FAE and the plurality of gate lines GLA, GLB, GLC, GLD, and GLE may extend in an direction.

FIGS. 2 through 14 are cross-sectional views taken along lines A-A', B-B', C-C D-D', and E-E'.

Figure 9:
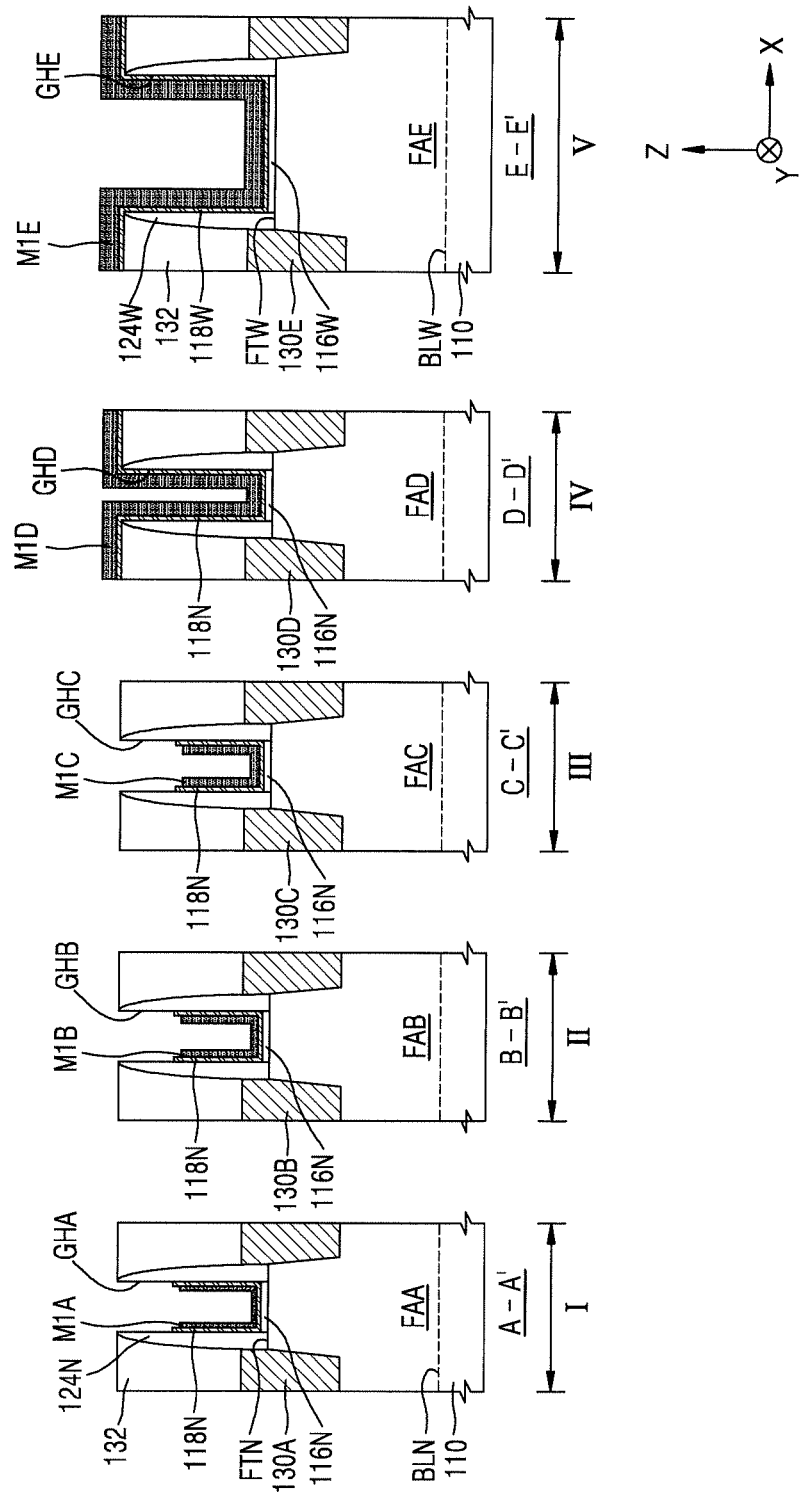
Figure 10:
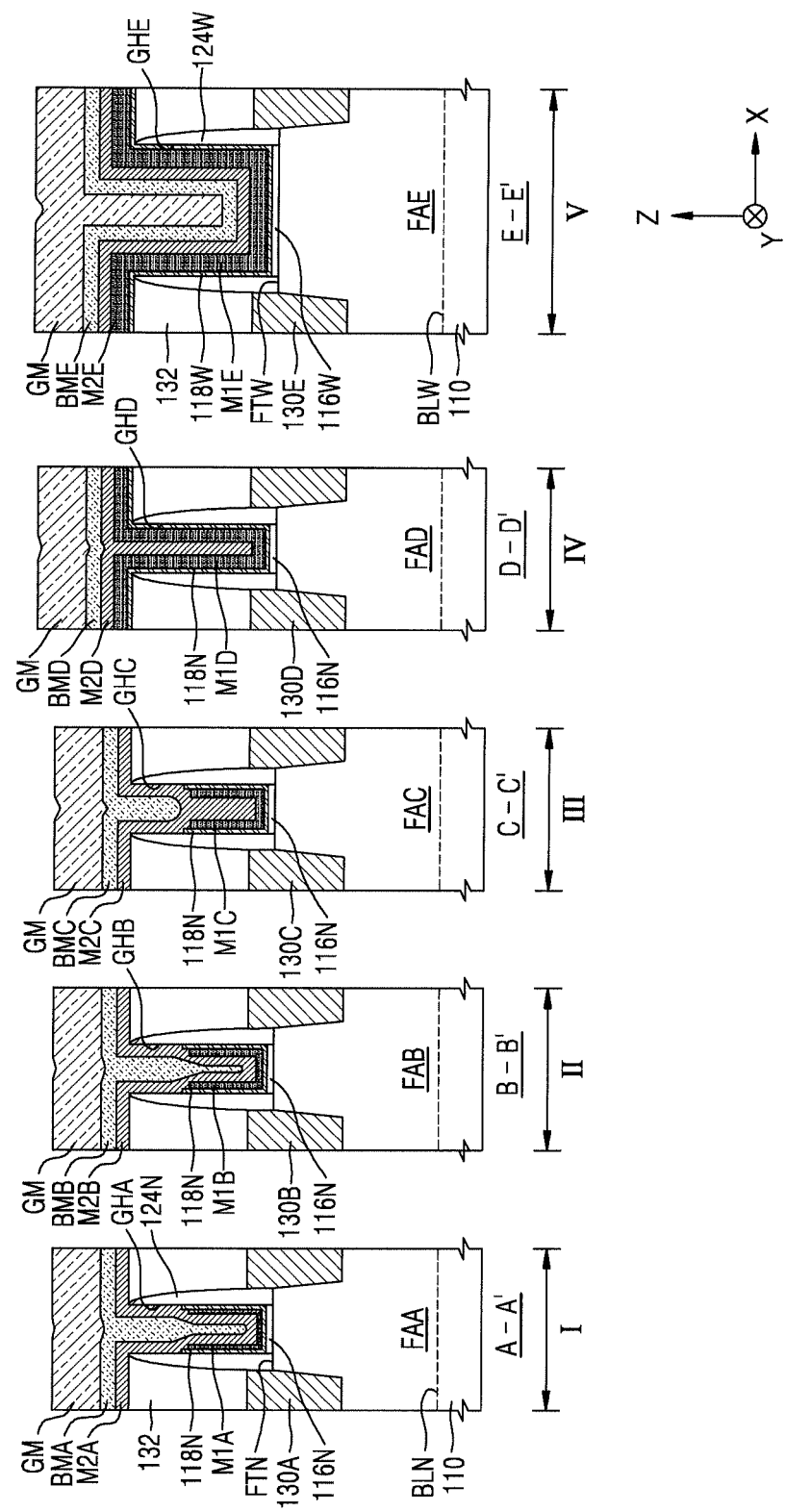
Figure 11:
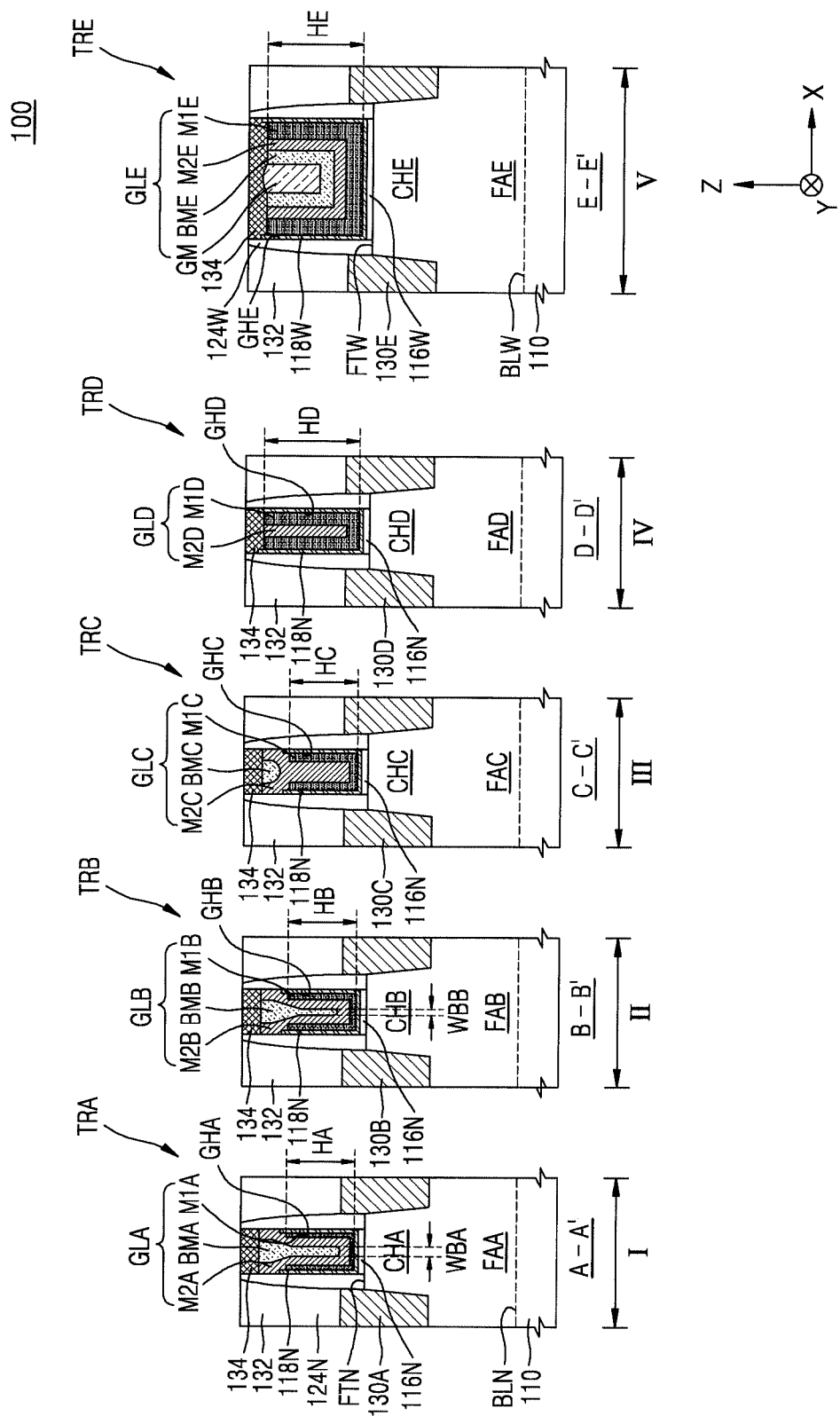
FIG. 11 is a cross-sectional view illustrating a semiconductor device according to an embodiment of the inventive concept.

FIGS. 2 through 10 are cross-sectional views illustrating a method of manufacturing a semiconductor device according to an embodiment of the inventive concept, and FIG. 11 is a cross-sectional view illustrating a semiconductor device according to an embodiment of the inventive concept.

Figure 2:
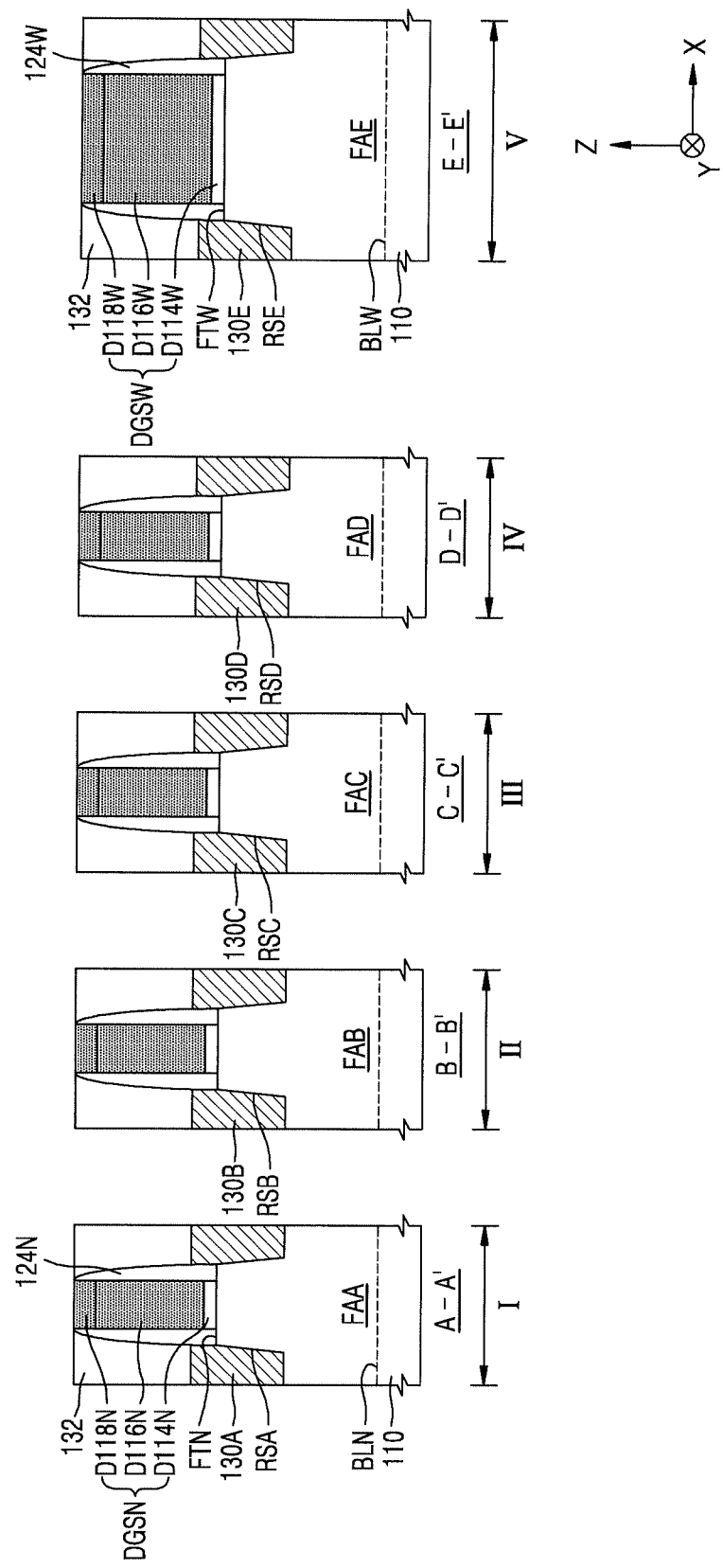
FIGS. 2 through 10 are cross-sectional views illustrating a method of manufacturing a semiconductor device according to an embodiment of the inventive concept in a stepwise manner.

Referring to FIG. 2, a substrate 110 having first through fifth fin-type active regions FAA, FAB, FAC, FAD, and FAE in the first through fifth regions I, II, III, IV, and V, respectively, is provided. The first region I and the second region II may be, according to an embodiment, an NMOS transistor region, and the third region III and the fourth region IV may be, according to an embodiment, a PMOS transistor region. The fifth region V may be, according to an embodiment, a PMOS transistor region or an NMOS transistor region.

The substrate 110 may include a semiconductor such as Si or Ge, or a compound semiconductor such as SiGe, SiC, GaAs, InAs, or InP. The substrate 110 may include a conductive region, according to an embodiment, an impurity-doped well or an impurity-doped structure.

The first fin-type active region FAA protrudes from the substrate 110 in the first region I; the second fin-type active region FAB protrudes from the substrate 110 in the second region II; the third fin-type third region FAC protrudes from the substrate 110 in the third region III; and the fourth fin-type active region FAD protrudes from the substrate 110 in the fourth region IV. The fifth fin-type active region FAE protrudes from the substrate 110 in the fifth region V.

The first through fifth fin-type active regions FAA, FAB, FAC, FAD, and FAE may each include a P-type or N-type impurity diffusion regions according to a channel type of a MOS transistor to be formed. For example, the first fin-type active region FAA and the second fin-type active region FAB may include a P-type impurity diffusion region, and the third fin-type active region FAC and the fourth fin-type active region FAD may include an N-type impurity diffusion region. For example, the fifth fin-type active region FAE may include an N-type impurity diffusion region, but is not limited thereto. For example, the fifth fin-type active region FAE may include a P-type impurity diffusion region.

The first through fourth fin-type active regions FAA, FAB, FAC, and FAD may have a first level BL1. The first level BL1 is approximately the lowest level. The fifth fin-type active region FAE may have a second level BL2. In some embodiments, the first level BL1 and the second level BL2 may be approximately same, but are not limited thereto.

The first through fourth fin-type active regions FAA, FAB, FAC, and FAD may have a first top surface FTN approximately at the same level. The fifth fin-type active region FAE may have a second top surface FTW. In some embodiments, the first top surface FTN1 and the second top surface FTNW may be approximately at the same level, but are not limited thereto.

A first dummy gate structure DGSN extending while intersecting the first through fourth fin-type active regions FAA, FAB, FAC, and FAD is formed on the first through fourth fin-type active regions FAA, FAB, FAC, and FAD in the first through fourth regions I, II, III, and IV, and a second dummy gate structure DGSW extending while intersecting the fifth fin-type active region FAE is formed on the fifth fin-type active region FAE in the fifth region V. A width of the second dummy gate structure DGSW may be greater than a width of the first dummy gate structure DGSN.

The first dummy gate structure DGSN may include a first dummy gate insulating film D114N, a first dummy gate line D116N, and a first dummy gate capping layer D118N that are sequentially stacked on the first through fourth fin-type active regions FAA, FAB, FAC, and FAD. The first dummy gate insulating film D114N may include silicon oxide. The first dummy gate capping layer D118N may include at least one of silicon oxide, silicon nitride, and silicon oxynitride.

The second dummy gate structure DGSW may include a second dummy gate insulating film D114W, a second dummy gate line D116W, and a second dummy gate capping layer D118W that are sequentially stacked on the fifth fin-type active region FAE. The second dummy gate insulating film D114W, the second dummy gate line D116W, and the second dummy gate capping layer D118W may be formed of the same material as the first dummy gate insulating film D114N, the first dummy gate line D116N, and the first dummy gate capping layer D118N, respectively.

A first insulating spacer 124N covering both sidewalls of the first dummy gate structure DGSN in the first through fourth regions I, II, III and IV and a second insulating spacer 124W covering both sidewalls of the second dummy gate structure DGSW in the fifth region V are formed. The first insulating spacer 124N and the second insulating spacer 124W may be formed of the same material. The first insulating spacer 124N and the second insulating spacer 124W may include SiN, SiOCN, SiCN, or a combination thereof.

First through fourth recesses RSA, RSB, RSC, and RSD are formed by removing portions of the first through fourth fin-type active regions FAA, FAB, FAC, and FAD on both sides of the first dummy gate structure DGSN and the first insulating spacer 124N in the first through fourth regions I, II, III, and IV, and a fifth recess RSE is formed by removing a portion of the fifth fin-type active region FAE on both sides of the second dummy gate structure DGSW and the second insulating spacer 124W in the fifth region V. In some embodiments, the first through fourth recesses RSA, RSB, RSC, and RSD and the fifth recess RSE may further extend from both sides of the first insulating spacer 124N and both sides of the second insulating spacer 124W to a lower portion of the first insulating spacer 124N and a lower portion of the second insulating spacer 124W.

A semiconductor layer is formed from surfaces of the first and second fin-type active regions FAA and FAB exposed through the first and second recesses RSA and RSB on both sides of the first dummy gate structure DGSN in the first and second regions I and II, by using an epitaxial growth process, to thereby form first and second source/drain regions 130A and 130B. A semiconductor layer is formed from surfaces of the third and fourth fin-type active regions FAC and FAD exposed through the third and fourth recesses RSC and RSD on both sides of the first dummy gate structure DGSN in the third and fourth regions III and IV, by using an epitaxial growth process, to thereby form third and fourth source/drain regions 130C and 130D. A semiconductor layer is formed from a surface of the fifth fin-type active region FAE exposed through the fifth recesses RSE on both sides of the second dummy gate structure DGSW in the fifth region V, by using an epitaxial growth process, to thereby form a fifth source/drain region 130E. The first through fifth source/drain regions 130A, 130B, 130C, 130D, and 130E may be formed of an impurity-doped semiconductor layer, for example, Si, SiGe, or SiC doped with an impurity. For example, in some embodiments, the first and second source/drain regions 130A and 130B may be a semiconductor layer doped with an N-type impurity, and the third and fourth source/drain regions 130C and 130D may be a semiconductor layer doped with a P-type impurity. For example, the fifth source/drain region 130E may be a semiconductor layer doped with a P-type impurity, but is not limited thereto. For example, the fifth source/drain region 130E may be a semiconductor layer doped with an N-type impurity. In some embodiments, the fifth source/drain region 130E may be formed simultaneously using the epitaxial growth process in which the third and fourth source/drain regions 130C and 130D are formed. In some other embodiments, the fifth source/drain region 130E may be formed simultaneously using the epitaxial growth process in which the first and second source/drain regions 130A and 130B are formed.

An intergate insulating layer 132 covering the first through fifth source/drain regions 130A, 130B, 130C, 130D, and 130E, the first and second dummy gate structures DGSN and DGSW, and the first and second insulating spacers 124N and 124W is formed in the first through fifth regions I, II, III, IV, and V.

In order to form the intergate insulating layer 132, for example, an insulating layer covering the first through fifth source/drain regions 130A, 130B, 130C, 130D, and 130E, the first and second dummy gate structures DGSN and DGSW, and the first and second insulating spacers 124N and 124W with a sufficient thickness may be formed in the first through fifth regions I, II, III, IV, and V. Next, a resultant product in which the insulating layer is formed may be planarized to expose the first and second dummy gate structures DGSN and DGSW, thereby forming the intergate insulating layer 132 which has a planarized top surface.

Figure 3:
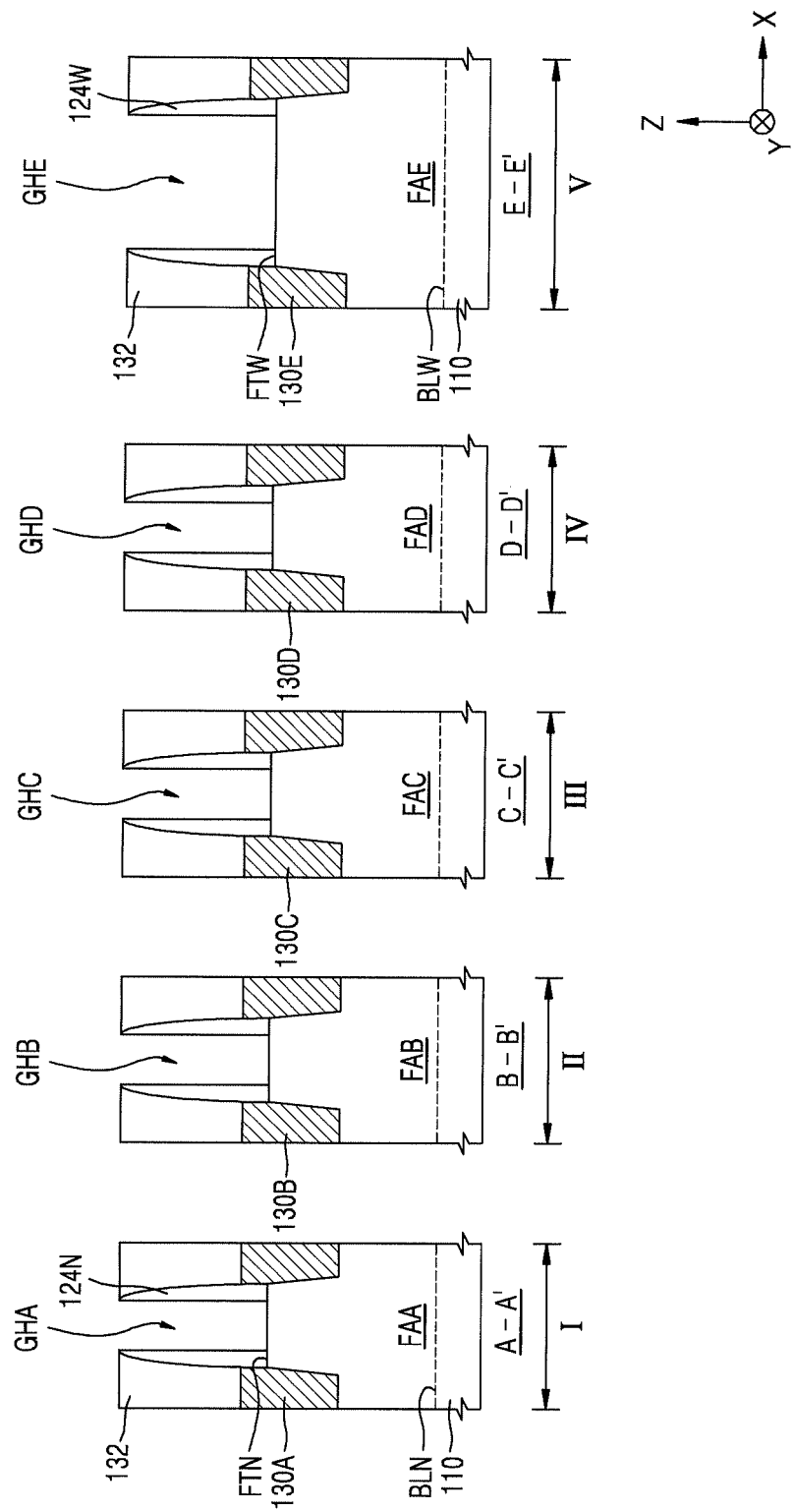

Referring to FIG. 3, the first and second dummy gate structures DGSN and DGSW exposed through the intergate insulating layer 132 in the first through fifth regions I, II, III, IV and V are removed to form first through fifth gate spaces GHA, GHB, GHC, GHD, and GHE in the first through fifth regions I, II, III, IV and V.

The first and second insulating spacers 124N and 124W and the first through fifth fin-type active regions FAA, FAB, FAC, FAD, and FAE may be exposed through the first through fifth gate spaces GHA, GHB, GHC, GHD, and GHE.

Figure 4:
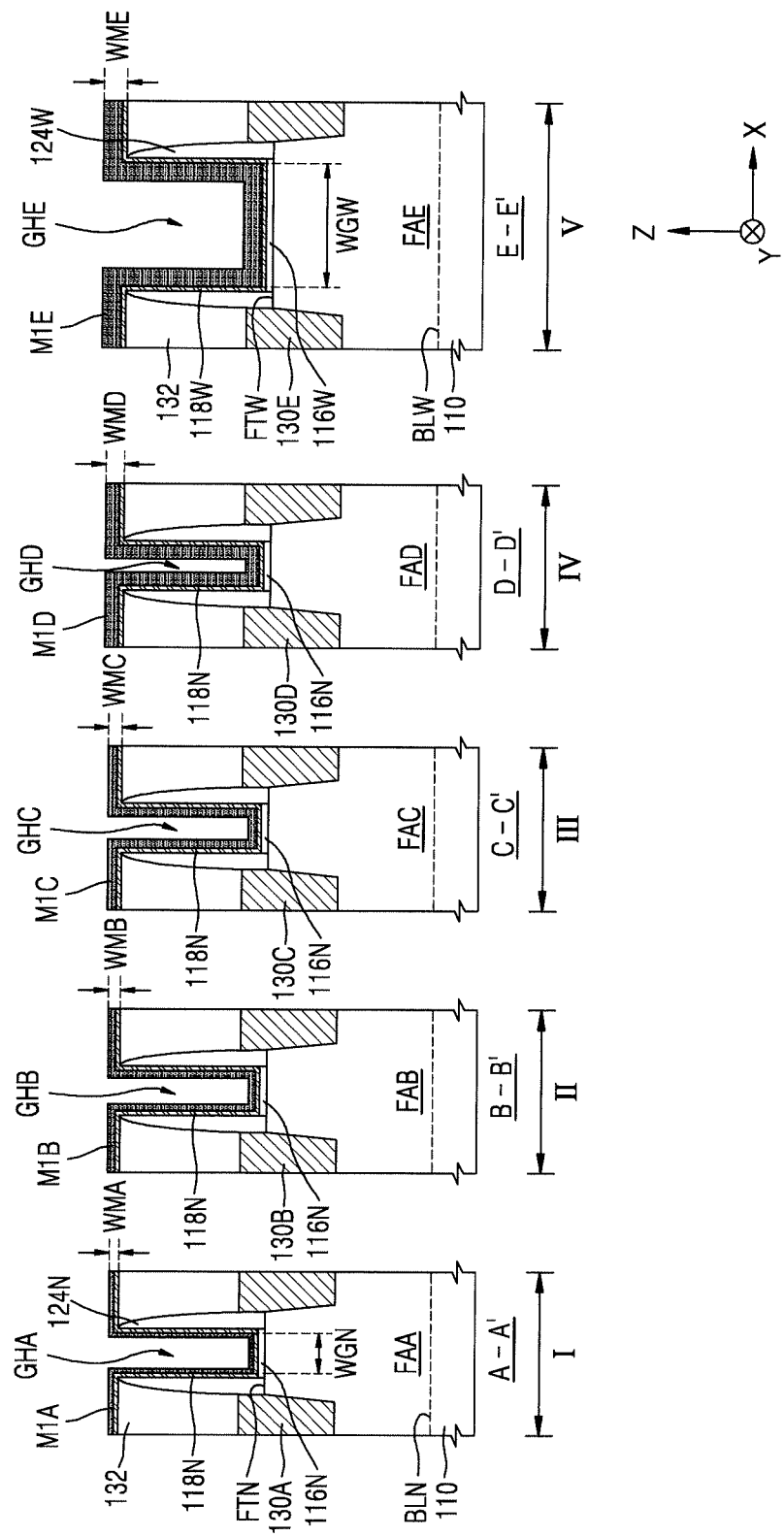

Referring to FIG. 4, the first interface layer 116N and the first gate insulating layer 118N are formed in the first through fourth gate spaces GHA, GHB, GHC, and GHD in the first through fourth regions I, II, III, and V, and the second interface layer 116N and the second gate insulating layer 118W are formed in the fifth gate space GHE in the fifth region V. In some embodiments, the first and second interface layers 116N and 116W may be formed by oxidizing portions of the first through fifth fin-type active regions FAA, FAB, FAC, FAD, and FAE exposed in the first through fifth gate spaces GHA, GHB, GHC, GHD, and GHE.

The first and second interface layers 116N and 116W may be formed on top surfaces of the first through fifth fin-type active regions FAA, FAB, FAC, FAD, and FAE exposed on bottom surfaces of the first through fifth gate spaces GHA, GHB, GHC, GHD, and GHE.

The first and second gate insulating layers 118N and 118W may be formed to cover top surfaces of the first interface layer 116N and the second interface layer 116W, internal side surfaces of the first through fifth gate spaces GHA, GHB, GHC, GHD, and GHE, and the top surface of the intergate insulating layer 132. The first and second gate insulating layers 118N and 118W may be formed by, for example, an atomic layer deposition (ALD), chemical vapor deposition (CVD), or physical vapor deposition (PVD) process.

A space defined by the first gate insulating layer 118N in each of the first through fourth gate spaces GHA, GHB, GHC, and GHD may have a first width WGN of the same value, and a space defined by the second gate insulating layer 118W in the fifth gate space GHE may have a second width WGW that is greater than the first width WGN.

First through fourth lower metal-containing layers M1A, M1B, M1C, and M1D are formed on the first gate insulating layer 118N in each of the first through fourth regions I, II, III, and IV, and a fifth lower metal-containing layer M1E is formed on the second gate insulating layer 118W in the fifth region V. The first through fifth lower metal-containing layers M1A, M1B, M1C, M1D, and M1E may be formed of a conductive material having a work function of 4.5 eV or higher. The first through fifth lower metal-containing layers M1A, M1B, M1C, M1D, and M1E may be formed of, for example, a conductive material without Al. In some embodiments, the first through fifth lower metal-containing layers M1A, M1B, M1C, M1D, and M1E may be formed of TiN, TaN, W, WCN, or a combination thereof. In some embodiments, all or a portion of each of the first through fifth lower metal-containing layers M1A, M1B, M1C, M1D, and M1E may be formed of the same material.

The first through fourth lower metal-containing layers M1A, M1B, M1C, and M1D may be conformally formed on the first gate insulating layer 118N so as not to completely fill the first through fourth gate spaces GHA, GHB, GHC, and GHD; and the fifth lower metal-containing layer M1E may be conformally formed on the second gate insulating layer 118W so as not to completely fill the fifth gate space GHE. The first through fifth lower metal-containing layers M1A, M1B, M1C, M1D, and M1E have first through fifth thicknesses WMA, WMB, WMC, WMD, and WME, respectively. The first thickness WMA may have a value smaller than the second thickness WMB. The second thickness WMB may have a value smaller than the third thickness WMC. The third thickness WMC may have a value smaller than the fourth thickness WMD. The fifth thickness WME may have a value greater than the fourth thickness WMD, but is not limited thereto. In some embodiments, the fifth thickness WME may have a value equal to or less than the fourth thickness WMD.

The first through fifth lower metal-containing layers M1A, M1B, M1C, M1D, and M1E may be formed by, for example, an ALD, CVD, or PVD process. In some embodiments, each of the first through fourth lower metal-containing layers M1A, M1B, M1C, and M1D may be formed by an additional deposition process.

In some embodiments, a portion of each of the first through fourth lower metal-containing layers M1A, M1B, M1C, and M1D may be formed in the same deposition process. For example, in a deposition operation of forming the first lower metal-containing layer M1A, the second through fourth lower metal-containing layers M1B, M1C, and M1D each having the first thickness WMA may be formed together; in a deposition operation of forming the remaining portion of the second lower metal-containing layer M1B, a portion of each of the third and fourth lower-metal-containing layers M1C and M1D may be formed together; in a deposition operation of forming the remaining portion of the third lower metal-containing layer M1C, a portion of the fourth lower metal-containing layer M1D may be formed together; and the remaining portion of the fourth lower metal-containing layer M1D may be formed in a separate deposition operation. The fifth lower metal-containing layer M1E may be formed in a separate deposition operation from the first through fourth lower metal-containing layers M1A, M1B, M1C, and M1D, or at least a portion of the fifth lower metal-containing layer M1E may be formed in a deposition operation of forming the first through fourth lower metal-containing layers M1A, M1B, M1C, and M1D.

In some embodiments, a dielectric film barrier layer (not shown) may be formed between the first and second gate insulating layers 118N and 118W and the first through fifth lower metal-containing layers M1A, M1B, M1C, M1D, and M1E. The dielectric film barrier layer may be formed of, for example, at least one metal selected from Ti, Ta, W, Ru, Nb, Mo, and Hf, a metal nitride, a metal carbide, a metal silicon nitride, or a combination thereof.

Figure 5:
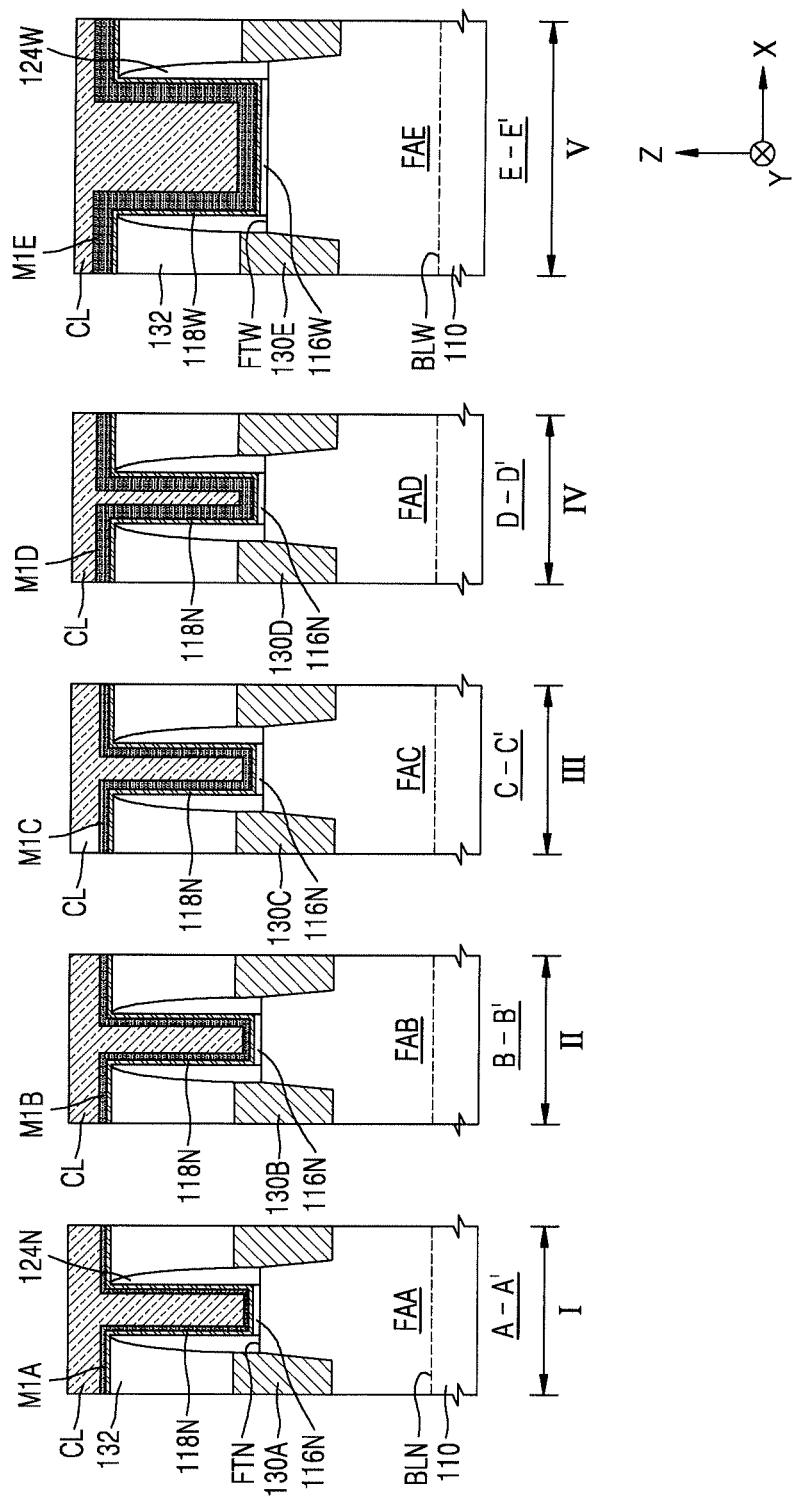

Referring to FIG. 5, a coating layer CL covering the first through fifth lower metal-containing layers M1A, M1B, M1C, M1D, and M1E and filling all of the first through fifth gate spaces GHA, GHB, GHC, GHD, and GHE (see FIG. 4) in each of the first through fifth regions I, II, III, IV, and V is formed. The coating layer CL may be formed of, for example, a carbon-based film. The carbon-based film may be formed of, for example, an amorphous carbon layer (ACL) or a carbon-based spin-on hardmask (C-SOH).

Figure 6:
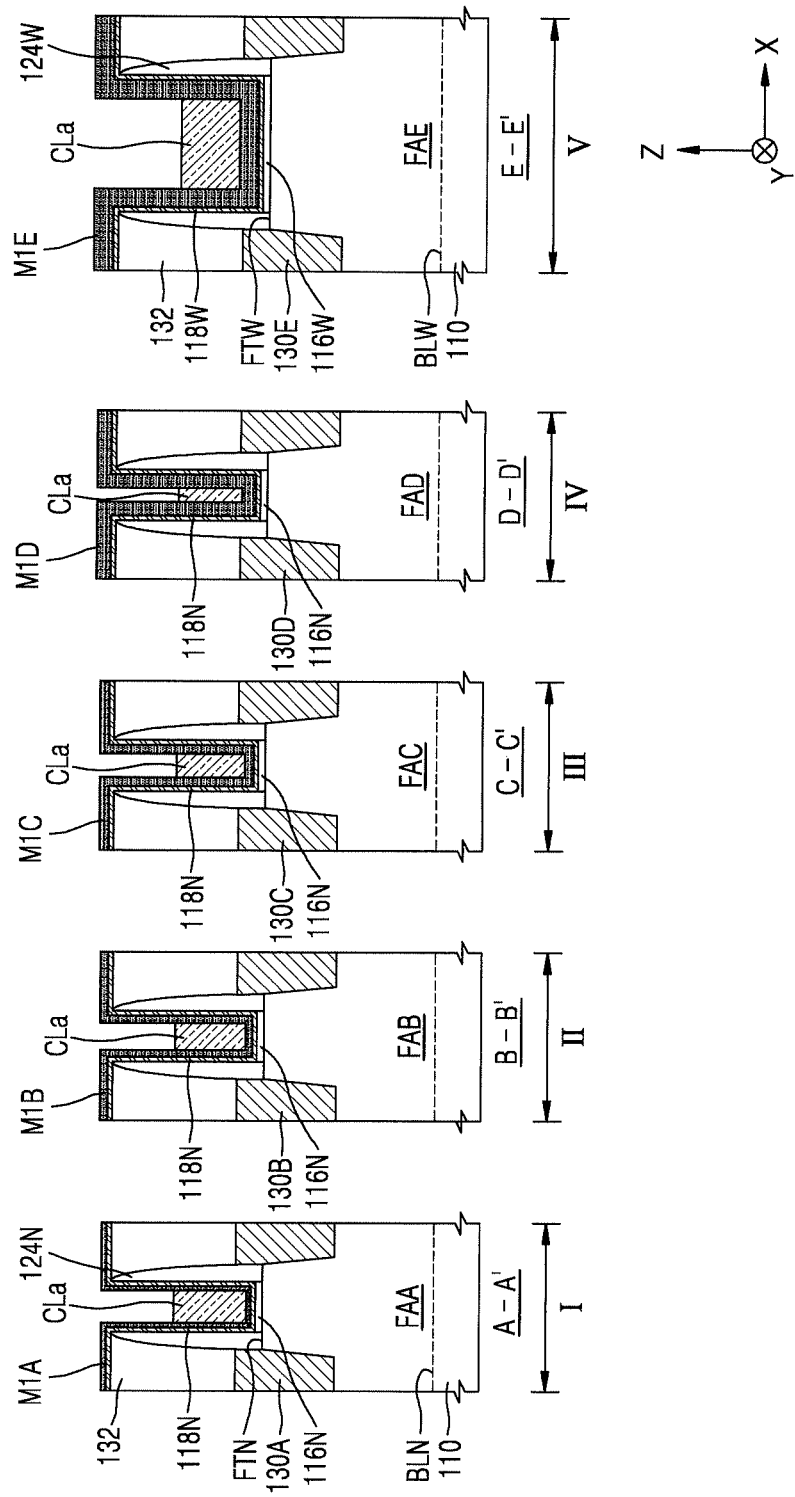

Referring to FIG. 6, a portion of the coating layer CL (FIG. 5) is removed from each of the first through fifth regions I, II, III, IV, and V to form a cover layer CLa covering lower portions of the first through fifth gate spaces GHA, GHB, GHC, GHD, and GHE in the first through fifth lower metal-containing layers M1A, M1B, M1C, M1D, and M1E.

Figure 7:
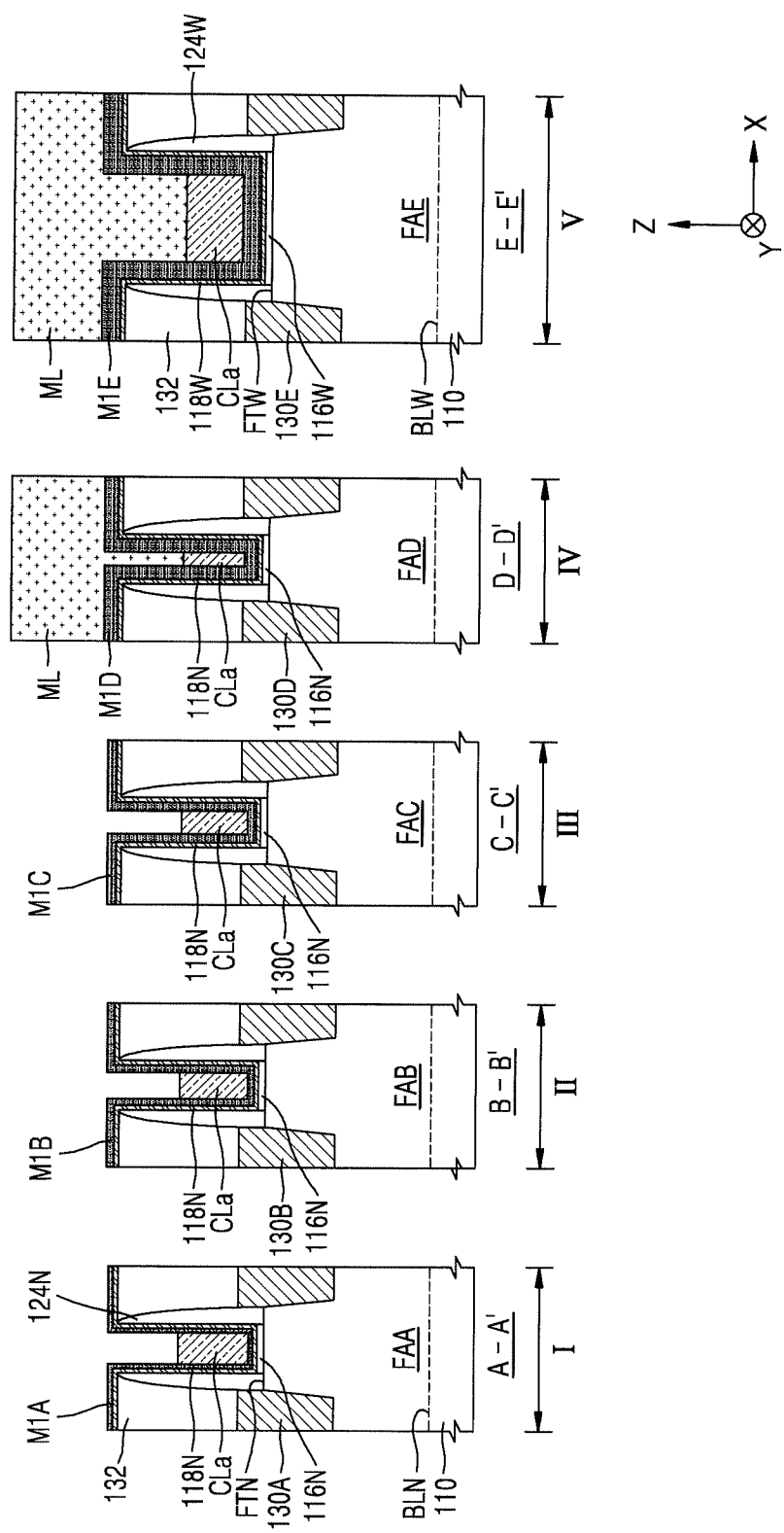

Referring to FIG. 7, a mask layer ML covering all of the cover layer CLa and the fourth and fifth lower metal-containing layers M1D and M1E in each of the fourth region IV and the fifth region V is formed. The mask layer ML may be formed of, for example, a photoresist. The mask layer ML is not formed in the first through third regions I, II, and III.

Figure 8:
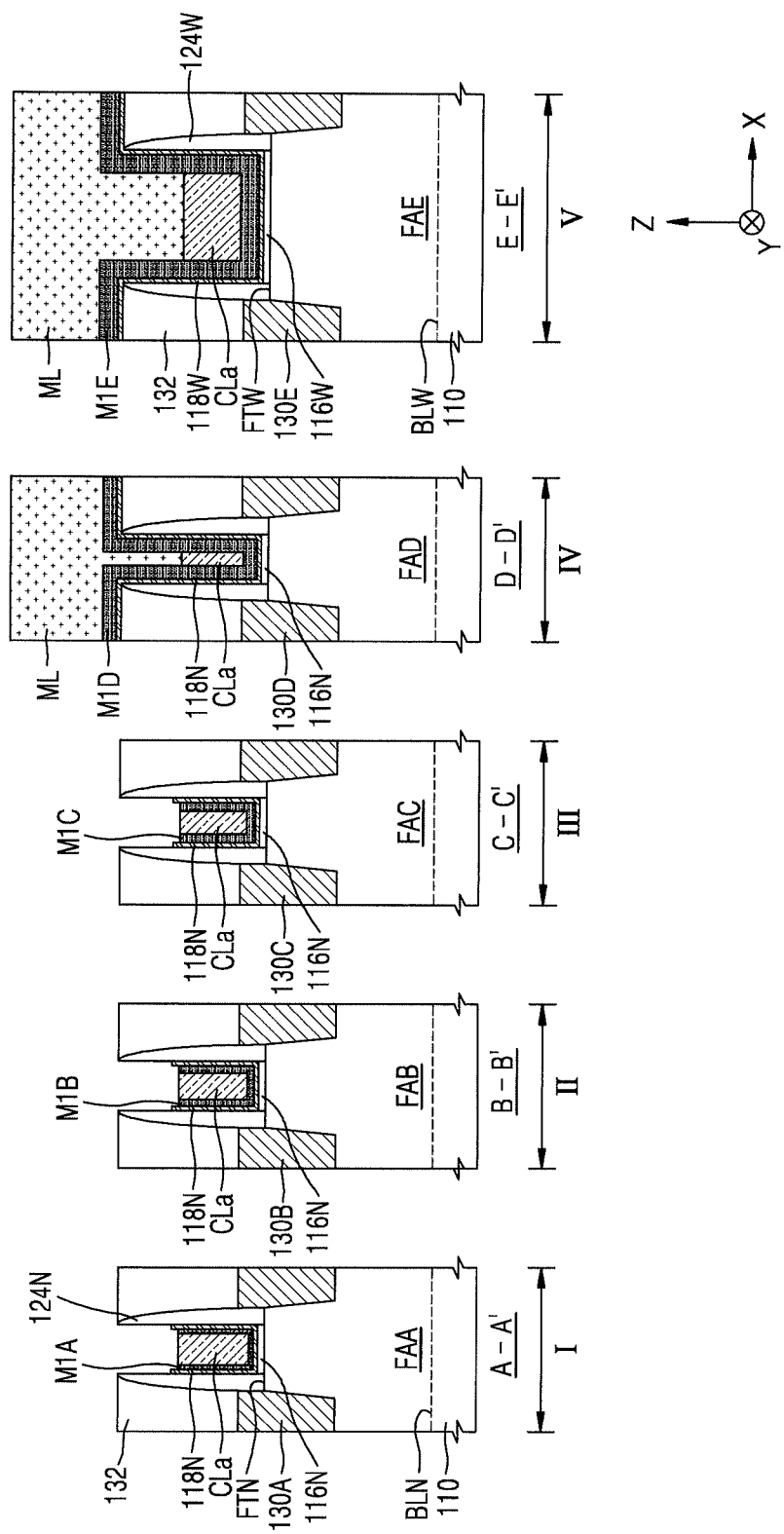

Referring to FIG. 8, a portion of the first gate insulating layer 118N and a portion of the first through third lower metal-containing layers M1A, M1B, and M1C are removed in the first through third regions I, II, and III. Lower portions of the first through third lower metal-containing layers M1A, M1B, and M1C covered by the cover layer CLa may not be removed. In addition, a portion of the first gate insulating layer 118N that is exposed as the portions of the first through third lower metal-containing layers M1A, M1B, and M1C are removed may also be removed together. In some embodiments, an uppermost end of the first gate insulating layer 118N in each of the first to third regions I, II, and III may have a higher level than an uppermost end of a remaining portion of each of the first through third lower metal-containing layers M1A, M1B, and M1C.

The fourth and fifth lower metal-containing layers M1D and M1E and the first and second gate insulating layers 118N and 118W covered by the mask layer ML in the fourth region IV and the fifth region V may be left without being removed.

Referring to FIG. 9, the mask layer ML (FIG. 8) and the cover layer CLa (FIG. 8) may be removed. The mask layer ML and the cover layer CLa may be removed by, for example, an ashing process or a strip process.

Referring to FIG. 10, first through fifth upper metal-containing layers M2A, M2B, M2C, M2D, and M2E and first through fifth conductive barrier layers BMA, BMB, BMC, BMD, and BME may be sequentially formed on the first through fifth lower metal-containing layers M1A, M1B, M1C, M1D, and M1E in the first through fifth regions I, II, III, IV, and V, respectively.

The first through fifth upper metal-containing layers M2A, M2B, M2C, M2D, and M2E may be formed of materials different from those of the first through fifth lower metal-containing layers M1A, M1B, M1C, M1D and M1E.

The first through fifth upper metal-containing layers M2A, M2B, M2C, M2D, and M2E may be formed of the same material. The first through fifth upper metal-containing layers M2A, M2B, M2C, M2D, and M2E may be formed of a conductive material having a work function of 4.5 eV or higher. The first through fifth upper metal-containing layers M2A, M2B, M2C, M2D, and M2E may be formed of, for example, an alloy containing Al, a conductive metal carbide containing Al, a conductive metal nitride containing Al, or a combination thereof. The first through fifth upper metal-containing layers M2A, M2B, M2C, M2D, and M2E may be formed of TiAl, TiAlC, TiAlN, or a combination thereof. The first through fifth upper metal-containing layers M2A, M2B, M2C, M2D, and M2E may be formed together by, for example, an ALD, CVD, or PVD process. The first through fifth upper metal-containing layers M2A, M2B, M2C, M2D, and M2E in the first through fifth regions I, II, III, IV, and V may be formed to each have the same thickness.

In the fourth region IV, the fourth upper metal-containing layer M2D may completely fill the fourth gate space GHD. The first through third upper metal-containing layers M2A, M2B, and M2C and the fifth upper metal-containing layer M2E in the first through third regions I, II, and III and the fifth region V may fill only a portion of the first through third gate spaces GHA, GHB, and GHC and the fifth gate space GHE.

In the third region III, the third upper metal-containing layer M2C may completely fill a space defined by the third lower metal-containing layer M1C in the third gate space GHC. In some embodiments, the first and second upper metal-containing layers M2A and M2B in the first and second regions I and II may respectively fill only a portion of the first and second gate spaces GHA and GHB defined by the first and second lower metal-containing layers M1A and M1B, but are not limited thereto. For example, at least one of the first and second upper metal-containing layers M2A and M2B in the first and second regions I and II may completely fill a portion of the first and second of the first and second gate spaces GHA and GHB defined by the first and second lower metal-containing layers M1A and M1B, respectively.

The first through fifth conductive barrier layers BMA, BMB, BMC, BMD, and BME may be formed of the same material. The first through fifth conductive barrier layers BMA, BMB, BMC, BMD, and BME may be formed of a metal nitride, for example, TiN, TaN, or a combination thereof. The first through fifth conductive barrier layers BMA, BMB, BMC, BMD, and BME may be formed together by, for example, an ALD, CVD, or PVD process. The first through fifth conductive barrier layers BMA, BMB, BMC, BMD, and BME may be formed to each have the same thickness in the first through fifth regions I, II, III, IV and V, respectively.

In the first through third regions I, II, and III, the first through third conductive barrier layers BMA, BMB, and BMC may completely fill the first through third gate spaces GHA, GHB, and GHC. In the fifth region V, the fifth conductive barrier layer BME may fill only a portion of the fifth gate space GHE.

The first through third conductive barrier layers BMA, BMB, and BMC may extend into the first through third gate spaces GHA, GHB, and GHC. In some embodiments, a lowermost end of the third conductive barrier layer BMC may be at a higher level than lowermost ends of the first and second conductive barrier layers BMA and BMB.

The first and second conductive barrier layers BMA and BMB may respectively extend into a space defined by the first and second lower metal-containing layers M1A and M1B. The first and second conductive barrier layers BMA and BMB may have a narrower width than an upper portion in the first and second gate spaces GHA and GHB.

A gap fill metal layer GM is formed on the first through fifth conductive barrier layers BMA, BMB, BMC, BMD and BME in the first through fifth regions I, II, III, IV and V. The gap fill metal layer GM may be formed of, for example, tungsten (W). In the fifth region V, the gap fill metal layer GM may completely fill the fifth gate space GHE.

Referring to FIG. 11, a portion of the gap fill metal layer GM formed on the intergate insulating layer 132 in the first through fifth regions I, II, III, IV and V, portions of the first through fifth conductive barrier layers BMA, BMB, BMC, BMD, and BME, and portions of the first through fifth upper metal-containing layers M2A, M2B, M2C, M2D, and M2E may be removed to form the first through fifth gate lines GLA, GLB, GLC, GLD, and GLE. In a process of forming the first through fifth gate lines GLA, GLB, GLC, GLD, and GLE, the fourth conductive barrier layer BMD (FIG. 10) may be completely removed.

In the process of forming the first through fifth gate lines GLA, GLB, GLC, GLD, and GLE, a portion of the gap fill metal layer GM, portions of the first through fifth conductive barrier layers BMA, BMB, BMC, BMD, and BME, and portions of the first through fifth upper metal-containing layers M2A, M2B, M2C, M2D, M2E formed on the first through fifth gate spaces GHA, GHB, GHC, GHD, and GHE may be further removed to form a gate capping layer 134 filling portions above the first through fifth gate spaces GHA, GHB, GHC, GHD, and GHE. In some embodiments, uppermost ends of the first through fifth gate lines GLA, GLB, GLC, GLD, and GLE and an uppermost end of the intergate insulating layer 132 may be formed to be substantially at the same level, by omitting the gate capping layer 134.

The semiconductor device 100 may include the first through fifth regions I, II, III, IV, and V. In some embodiments, the semiconductor device 100 may not include at least one of the first region I, the second region II, and the third region III.

A first transistor TRA, a second transistor TRB, a third transistor TRC, a fourth transistor TRD, and a fifth transistor TRE may be disposed in the first region I, the second region II, the third region III, the fourth region IV, and the fifth region V, respectively.

The semiconductor device 100 includes the first through fifth fin-type active regions FAA, FAB, FAC, FAD, and FAC protruding from the substrate 110 in the first through fifth regions I, II, III, IV, and V of the substrate 110.

A first channel region CHA of the first fin-type active region FAA and a second channel region CHB of the second fin-type active region FAB may be regions doped with a first conductivity-type impurity, and a third channel region CHC of the third fin-type active region FAC and a fourth channel region CHD of the fourth fin-type active region FAD may be regions doped with a second conductivity-type impurity. The fifth channel region CHE of the fifth fin-type active region FAE may be a region doped with a second conductivity-type impurity, but is not limited thereto. For example, the fifth channel region CHE of the fifth fin-type active region FAE may be the region doped with a first conductivity-type impurity. For example, the first conductivity type may be p-type, and the second conductivity type may be n-type.

The first through fifth channel regions CHA, CHB, CHC, CHD, and CHE protrude in a fin shape in a direction (Z direction) perpendicular to a main surface of the substrate 110 (X-Y plane). The first through fourth channel regions CHA, CHB, CHC, and CHD are covered by the first interface layer 116N, and the fifth channel region CHE is covered by the second interface layer 116W. The first gate insulating layer 118N and the first through fourth gate lines GLA, GLB, GLC, and GLD extend on the first interface layer 116N in the first through fourth regions I, II, III, and IV in a direction across the first through fourth fin-type active regions FAA, FAB, FAC, and FAD while covering the first through fourth channel regions CHA, CHB, CHC, and CHD. The second gate insulating layer 118W and the fifth gate line GLE extend on the second interface layer 116W in the fifth region V in a direction crossing the fifth fin-type active region FAE while covering the fifth channel region CHE.

The first transistor TRA may be formed at a point where the first fin-type active region FAA and the first gate line GLA intersect each other. The second transistor TRB may be formed at a point where the second fin-type active region FAB and the second gate line GLB intersect each other. The third transistor TRC may be formed at a point where the third fin-type active region FAC and the third gate line GLC intersect each other. The fourth transistor TRD may be formed at a point where the fourth fin-type active region FAD and the fourth gate line GLD intersect each other. The fifth transistor TRE may be formed at a point where the fifth fin-type active region FAE and the fifth gate line GLE intersect each other.

The first through fourth gate lines GLA, GLB, GLC, and GLD may have the first width WGN (FIG. 4), which is a width of a space defined by the first gate insulating layer 118N, in a direction (X direction) perpendicular to an extension direction (Y direction) of the first through fourth gate lines GLA, GLB, GLC, and GLD. The fifth gate line GLE may have the second width WGW (FIG. 4), which is a width of a space defined by the second gate insulating layer 118W, in the direction (X direction) perpendicular to the extension direction (Y direction) of the fifth gate line GLE. The first width WGN may be a channel length of each of the first transistor TRA, the second transistor TRB, the third transistor TRC, and the fourth transistor TRD, and the second width WGW may be a channel length of the fifth transistor TRE. That is, the second width WGW, which is the channel length of the fifth transistor TRE, may be greater than the first width WGN, which is the channel length of each of the first transistor TRA, the second transistor TRB, the third transistor TRC, and the fourth transistor TRD.

The first and second interface layers 116N and 116W may be formed by oxidizing a portion of the first through fifth fin-type active regions FAA, FAB, FAC, FAD, and FAE exposed in the first through fifth gate spaces GHA, GHB, GHC, GHD, and GHE. The first and second interface layers 116N and 116W may be each formed of a low-k material layer having a permittivity of 9 or less, for example, a silicon oxide layer, a silicon oxynitride layer, or a combination thereof.

The first and second gate insulating layers 118N and 118W may be formed of a silicon oxide film, a high-k film, or a combination thereof. The high-k film may be formed of a material having a dielectric constant greater than that of a silicon oxide film. The first and second gate insulating layers 118N and 118W may have a dielectric constant of about 10 to about 25. The first and second gate insulating layers 118N and 118W may be formed of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, or a combination thereof, but are not limtied thereto.

An uppermost end of the first gate insulating layer 118N in the fourth region IV may be located at a higher level than an uppermost end of the first gate insulating layer 118N in the first through third regions I, II, and III. The uppermost end of the first gate insulating layer 118N in the fourth region IV and the uppermost end of the second gate insulating layer 118W in the fifth region V may be located substantially at the same level.

The uppermost end of the first gate insulating layer 118N in each of the first through fourth regions I, II, III, and IV may have a higher level than uppermost ends of the first through fourth lower metal-containing layers M1A, M1B, M1C, and M1D. In the fifth region V, the uppermost end of the second gate insulating layer 118W may have a higher level than the uppermost end of the fifth lower metal-containing layer M1E.

The first gate line GLA may include the first lower metal-containing layer M1A, the first upper metal-containing layer M2A, and the first conductive barrier layer BMA. The second gate line GLB may include the second lower metal-containing layer M1B, the second upper metal-containing layer M2B, and the second conductive barrier layer BMB. The third gate line GLC may include the third lower metal-containing layer M1C, the third upper metal-containing layer M2C, and the third conductive barrier layer BMC. The fourth gate line GLD may include the fourth lower metal-containing layer M1D and the fourth upper metal-containing layer M2D. The fifth gate line GLE may include the fifth lower metal-containing layer M1E, the fifth upper metal-containing layer M2E, the fifth conductive barrier layer BME, and the gap fill metal layer GM.

The first through fifth lower metal-containing layers M1A, M1B, M1C, M1D, and M1E may perform a function of controlling a work function. Work functions of the first through fifth gate lines GLA, GLB, GLC, GLD, and GLE may be controlled based on a thickness of each of the first through fifth lower metal-containing layers M1A, M1B, M1C, M1D, and M1E. The first through fifth lower metal-containing layers M1A, M1B, M1C, M1D, and M1E may be formed of a conductive material having a work function of 4.5 eV or higher. The thickness of each of the first through fifth lower metal-containing layers M1A, M1B, M1C, M1D, and M1E is described with reference to FIG. 4, and thus detailed description thereof will be omitted.

Heights of the first through fifth lower metal-containing layers M1A, M1B, M1C, M1D, and M1E from a lowermost end to an uppermost end thereof may be first through fifth heights HA, HB, HC, HD, and HE, respectively. The first through third heights HA, HB, and HC may have the same value. The fourth and fifth heights HD and HE may have values greater than the first through third heights HA, HB, HC.

The first through fifth lower metal-containing layers M1A, M1B, M1C, M1D, and M1E may have U-shaped cross-sections on a plane (X-Z plane) perpendicular to the extension direction (Y direction) of the first through fifth gate lines GLA, GLB, GLC, GLD, and GLE.

The first through fifth upper metal-containing layers M2A, M2B, M2C, M2D, and M2E may cover the first through fifth lower metal-containing layers M1A, M1B, M1C, M1D, and M1E. The first through fifth upper metal-containing layers M2A, M2B, M2C, M2D, and M2E may be formed of the same material. The first through fifth upper metal-containing layers M2A, M2B, M2C, M2D, and M2E may be formed of a conductive material having a work function of less than 4.5 eV.

Heights of the first through fifth upper metal-containing layers M2A, M2B, M2C, M2D, and M2E from lowermost ends to uppermost ends thereof may have approximately the same value. The uppermost end of each of the first through fifth upper metal-containing layers M2A, M2B, M2C, M2D, and M2E and the uppermost ends of the fourth and fifth lower metal-containing layers M1D and M1E may be located approximately at the same level.

The uppermost end of each of the first through third upper metal-containing layers M2A, M2B, and M2C may be located at a higher level than the uppermost end of each of the first through third lower metal-containing layers M1A, M1B, and M1C.

The first through third upper metal-containing layers M2A, M2B, and M2C respectively fill at least a portion of an inside of the U-shape of the first through third lower metal-containing layers M1A, M1B, and M1C, and may extend above the uppermost ends of the first through third lower metal-containing layers M1A, M1B, and M1C. In some embodiments, the third upper metal-containing layer M2C may completely fill the inside of the U-shape of the third lower metal-containing layer M1C, and extend above the uppermost end of the third lower metal-containing layer M1C.

The first through third upper metal-containing layers M2A, M2B, and M2C may have a U-shaped cross-section on a plane (X-Z plane) perpendicular to the extension direction (Y direction) of the first through third gate lines GLA, GLB, and GLC.

The fourth upper metal-containing layer M2D may completely fill the inside of the U-shape of the fourth lower metal-containing layer M1D, and the uppermost end of the fourth upper metal-containing layer M2D and the uppermost end of the fourth lower metal-containing layer M1D may be approximately at the same level.

The fifth upper metal-containing layer M2E may fill a portion of the inside the U-shape of the fifth lower metal-containing layer M1E, and the uppermost end of the fifth upper metal-containing layer M2E and the uppermost end of the fifth lower metal-containing layer M1E may be approximately at the same level. The fifth upper metal-containing layer M2E may have a cross-section having a U-shape in a plane (X-Z plane) perpendicular to the extension direction (Y direction) of the fifth gate line GLE.

The first through third conductive barrier layers BMA, BMB, and BMC may completely fill the inside of the U-shape of the first through third upper metal-containing layers M2A, M2B, and M2C, and the uppermost ends of the conductive barrier layers BMA, BMB, and BMC and the uppermost ends of the first through third upper metal-containing layers M2A, M2B, and M2C may be approximately at the same level.

The lowermost ends of the first and second conductive barrier layers BMA and BMB may be located at a level higher than the lowermost end of the third conductive barrier layer BMC. The lowermost end of the second conductive barrier layer BMB may be located approximately at the same level as the lowermost end of the first conductive barrier layer BMA, or at a higher level. The lowermost ends of the first and second conductive barrier layers BMA and BMB may be located at a level lower than the uppermost ends of the first through third upper metal-containing layers M2A, M2B, and M2C. The lowermost end of the third conductive barrier layer BMC may be located at a level higher than the uppermost ends of the first through third upper metal-containing layers M2A, M2B, and M2C.

In some embodiments, a width WBA of a lower end of the first conductive barrier layer BMA may be greater than a width WBB of a lower end of the second conductive barrier layer BMB.

The fifth conductive barrier layer BME may fill a portion of the inside the U-shape of the fifth upper metal-containing layer M2E, and the uppermost end of the fifth conductive barrier layer BME and the uppermost end of the fifth upper metal-containing layer M2E may be approximately at the same level. The fifth conductive barrier layer BME may have a cross-section having a U-shape in a plane (X-Z plane) perpendicular to the extension direction (Y direction) of the fifth gate line GLE.

The gap fill metal layer GM may completely fill the inside of the U-shape of the fifth conductive barrier layer BME. The uppermost end of the gap fill metal layer GM and the uppermost end of the fifth conductive barrier layer BME may be located approximately at the same level. In some embodiments, due to a difference in etching characteristics of the gap fill metal layer GM and the fifth conductive barrier layer BME, the uppermost end of the gap fill metal layer GM may be at a higher level than the uppermost end of the fifth conductive barrier layer BME. That is, the gap fill metal layer GM may have a shape protruding upwards (Z direction) from the uppermost end of each of the fifth lower metal-containing layer M1E, the fifth upper metal-containing layer M2E, and the fifth conductive barrier layer BME.

Heights from lowermost ends to uppermost ends of the first through fourth gate lines GLA, GLB, GLC, and GLD may be a fourth height HD that is approximately equal. A height from a lowermost end to an uppermost end of the fifth gate line GLE may be a fifth height HE that is approximately equal to the fourth height HD, which is the height of each of the first through fourth gate lines GLA, GLB, GLC, and GLD. However, in some embodiments, if the gap fill metal layer GM has a shape protruding upwards (Z direction), the height of the fifth gate line GLE may be greater than the heights of the first through fourth gate lines GLA, GLB, GLC, and GLD.

The first transistor TRA and the second transistor TRB may be an n-type MOSFET, and the third transistor TRC and the fourth transistor TRD may be a p-type MOSFET. The fifth transistor TRE may be a p-type MOSFET. In some embodiments, the fifth transistor TRE may be an n-type MOSFET.

An operating voltage of the first transistor TRA may be smaller than an operating voltage of the second transistor TRB, and an operating voltage of the third transistor TRC may be smaller than an operating voltage of the fourth transistor TRD. The operating voltages of the first through fourth transistors TRA, TRB, TRC, and TRD may be smaller than an operating voltage of the fifth transistor TRE. Magnitudes of the operating voltages of the first through fifth transistors TRA, TRB, TRC, TRD, and TRE may be compared by comparing absolute values of the operating voltages of the first through fifth transistors TRA, TRB, TRC, TRD, and TRE. It will be understood that, in some embodiments, the operating voltages can be respective threshold voltages of the different transistors.

An operating voltage of a semiconductor device may be determined according to a proportion of a lower metal-containing layer constituting a gate electrode and having a relatively small work function and that of an upper metal-containing layer constituting the gate electrode and having a relatively large work function.

For example, operating voltages of the first through fifth transistors TRA, TRB, TRC, TRD, and TRE of the semiconductor device 100 may be determined based on proportions of the first through fifth lower metal-containing layers M1A, M1B, M1C, M1D, and M1E and the first through fifth upper metal-containing layers M2A, M2B, M2C, M2D, and M2E in the first through fifth gate lines GLA, GLB, GLC, GLD, and GLE.

When a semiconductor device is scaled down, a proportion of an upper metal-containing layer in a gate electrode may be increased by increasing a height of the gate electrode. However, it may be difficult to increase a proportion of a lower metal-containing layer as a length of the gate electrode is decreased.

However, the semiconductor device 100 according to the inventive concept may include the fourth transistor TRD including a lower metal-containing layer having an increased proportion as the fourth height HD of the fourth lower metal-containing layer M1D is greater than the first through third heights HA, HB, and HC of the first through third lower metal-containing layers M1A, M1B, and M1C.

Accordingly, according to the semiconductor device 100 of the inventive concept, all of the first transistor TRA which is an n-type MOSFET having a relatively low operating voltage, the second transistor TRB which is an n-type MOSFET having a relatively high operating voltage, the third transistor TRC, which is a p-type MOSFET having a relatively high operating voltage, and the fourth transistor TRD, which is a p-type MOSFET having a relatively low operating voltage may be implemented.

In addition, as a height of the lower metal-containing layer M1D in the fourth gate line GLD of the fourth transistor TRD may be increased by using the mask layer ML (see FIG. 7) used to form the fifth gate line GLE of the fifth transistor TRE, a fourth transistor TRD which is a p-type MOSFET having a relatively low operating voltage may be realized without any additional process.

Figure 12:
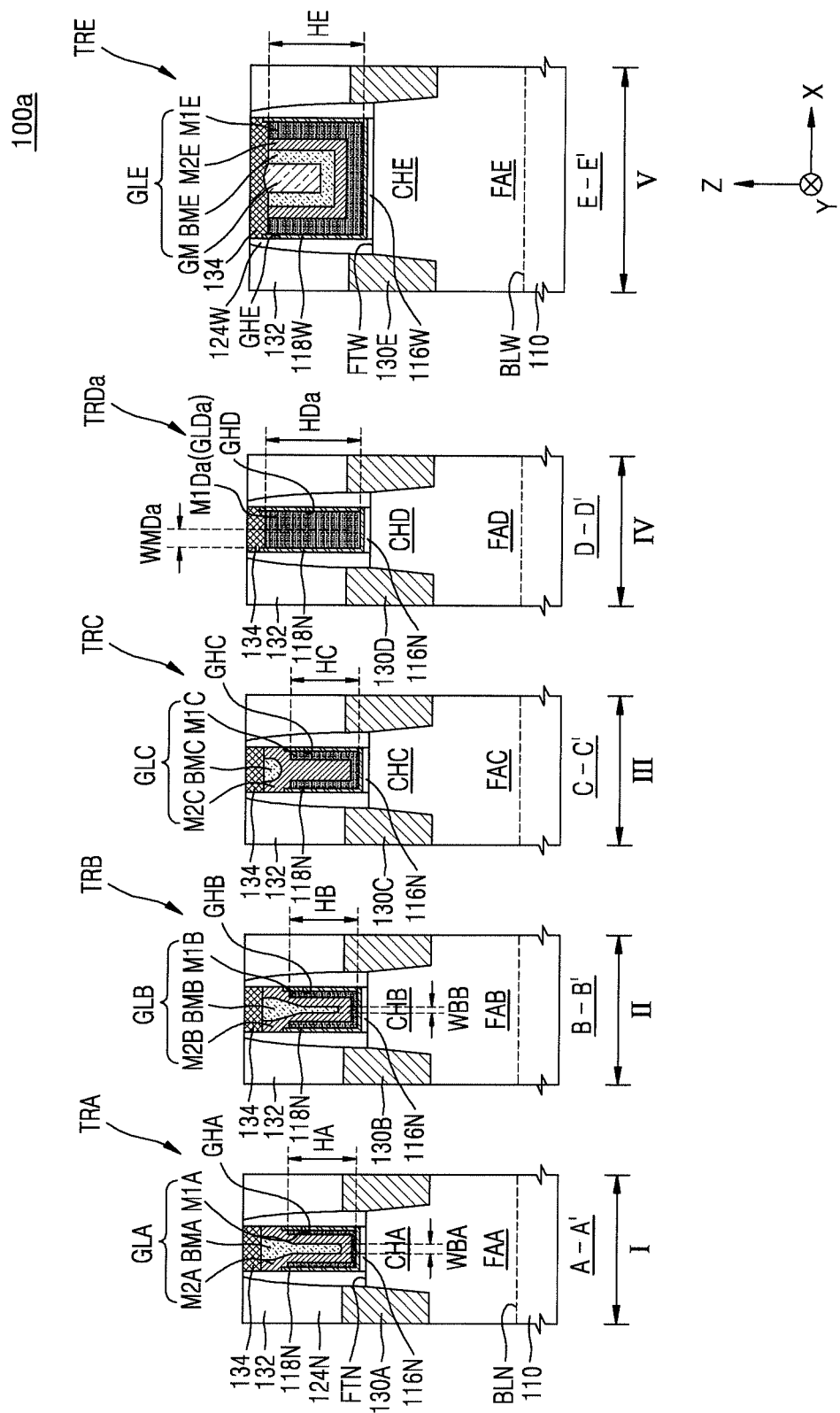
FIG. 12 is a cross-sectional view illustrating a semiconductor device according to an embodiment of the inventive concept.

FIG. 12 is a cross-sectional view illustrating a semiconductor device 100a according to an embodiment of the inventive concept. The semiconductor device 100a shown in FIG. 12 is the same as the semiconductor device 100 of FIG. 11 except that the semiconductor device 100a includes a fourth transistor TRDa instead of the fourth transistor TRD of FIG. 11.

Referring to FIG. 12, the semiconductor device 100a may include first through fifth regions I, II, III, IV, and V. In some embodiments, the semiconductor device 100 may not include at least one of the first region I, the second region II, and the third region III.

The first transistor TRA, the second transistor TRB, the third transistor TRC, the fourth transistor TRDa, and the fifth transistor TRE may be respectively disposed in the first region I, the second region II, the third region III, the fourth region IV, and the fifth region V.

The fourth transistor TRDa may be formed at a point where the fourth fin-type active region FAD and the fourth gate line GLDa intersect each other. The fourth gate line GLDa may be formed of a fourth lower metal-containing layer M1Da.

That is, when a fourth thickness WMDa, which is a thickness of the fourth lower metal-containing layer M1Da, is equal to or greater than half of the first width WGN (FIG. 4), the fourth gate line GLDa may be formed of only the fourth lower metal-containing layer M1Da. A fourth height HDa which is a height of the fourth lower metal-containing layer M1Da may be equal to the fifth height HE which is the height of the fifth lower metal-containing layer M1E.

As an operating voltage of the fourth transistor TRDa is determined by the fourth lower metal-containing layer M1Da in the semiconductor device 100a, the fourth transistor TRDa, which is a p-type MOSFET having a low operating voltage may be implemented.

Figure 13:
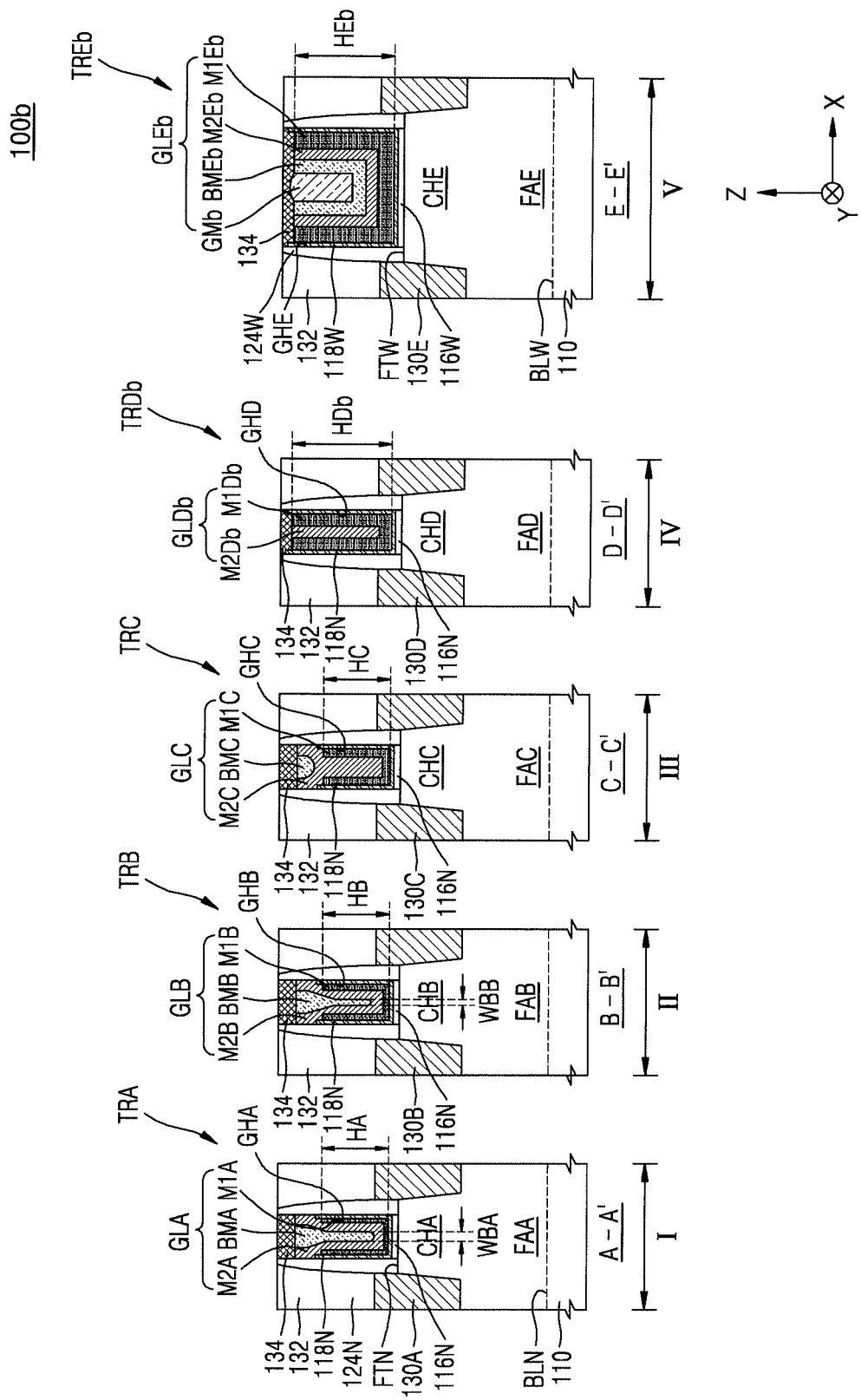
FIG. 13 is a cross-sectional view illustrating a semiconductor device according to an embodiment of the inventive concept.

FIG. 13 is a cross-sectional view illustrating a semiconductor device 100b according to an embodiment of the inventive concept. The semiconductor device 100b illustrated in FIG. 13 is the same as the semiconductor device 100 of FIG. 11 except that the semiconductor device 100b includes a fourth transistor TRDb and a fifth transistor TREb instead of the fourth transistor TRD and the fifth transistor TRE of FIG. 11, and thus repeated description will be omitted.

Referring to FIG. 13, the semiconductor device 100b may include first through fifth regions I, II, III, IV, and V. In some embodiments, the semiconductor device 100b may not include at least one of the first region I, the second region II, and the third region III.

The first transistor TRA, the second transistor TRB, the third transistor TRC, the fourth transistor TRDb, and the fifth transistor TREb may be respectively disposed in the first region I, the second region II, the third region III, the fourth region IV, and the fifth region V.

The fourth transistor TRDb may be formed at a point where the fourth fin-type active region FAD and a fourth gate line GLDb intersect each other, and the fifth transistor TREb may be formed at a point where the fifth fin-type active region FAE and a fifth gate line GLEb intersect.

The fourth gate line GLDb may include a fourth lower metal-containing layer M1Db and a fourth upper metal-containing layer M2Db. The fifth gate line GLEb may include a fifth lower metal-containing layer M1E, a fifth upper metal-containing layer M2Eb, a fifth conductive barrier layer BMEb, and a gap fill metal layer GMb.

The fourth gate line GLDb may have a fourth height HDb that is greater than the height of each of the first through third gate lines GLA, GLB, and GLC (the fourth height HD in FIG. 11). The fifth gate line GLEb may have a fifth height HEb which is approximately equal to the fourth height HDb which is the height of the fourth gate line GLDb. However, in some embodiments, when the gap fill metal layer GMb has a shape protruding upwards (Z direction), the height of the fifth gate line GLEb may be greater than the fourth height HDb of the fourth gate line GLDb.

In an operation of forming the first through fifth gate lines GLA, GLB, GLC, GLDb, and GLEb, when the first through fifth lower metal-containing layers M1A, M1B, M1C, M1Db, and M1Eb and the first through fifth upper metal-containing layers M2A, M2B, M2C, M2Db, and M2Eb have different etching characteristics, the heights of the first through third gate lines GLA, GLB, and GLC and the heights of the fourth and fifth gate lines GLDb and GLEb may have different values. When the first through fifth upper metal-containing layers M2A, M2B, M2C, M2Db, and M2Eb have etching properties, they are removed faster than the first through fifth lower metal-containing layers M1A, M1B, M1C, M1Db, and M1Eb, and thus, the heights of the fourth and fifth gate lines GLDb and GLEb may be greater than the heights of the first through third gate lines GLA, GLB, and GLC as illustrated in FIG. 13.

In some embodiments, although not illustrated, when the first through fifth lower metal-containing layers M1A, M1B, M1C, M1Db, and M1Eb have etching properties, they are removed faster than the first through fifth upper metal-containing layers M2A, M2B, M2C, M2Db, and M2Eb, and thus, the heights of the fourth and fifth gate lines GLDb and GLEb may be less than the heights of the first through third gate lines GLA, GLB, and GLC.

Figure 14:
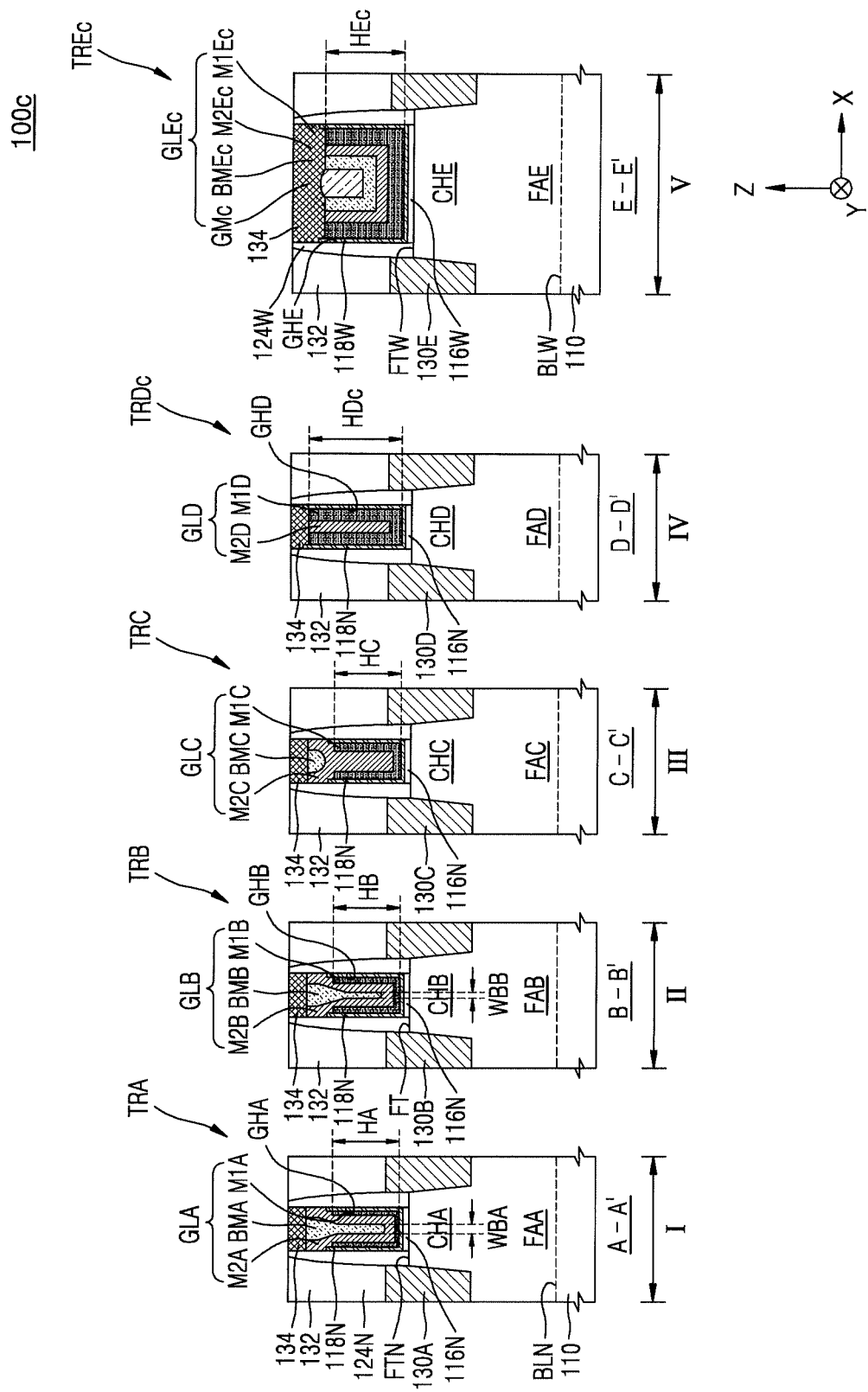
FIG. 14 is a cross-sectional view illustrating a semiconductor device according to an embodiment of the inventive concept.

FIG. 14 is a cross-sectional view illustrating a semiconductor device 100c according to an embodiment of the inventive concept. The semiconductor device 100c shown in FIG. 14 is the same as the semiconductor device 100 of FIG. 11 except that the semiconductor device 100c includes a fifth transistor TREc instead of the fifth transistor TRE of FIG. 11.

Referring to FIG. 14, the semiconductor device 100c may include first through fifth regions I, II, III, IV, and V. In some embodiments, the semiconductor device 100 may not include at least one of the first region I, the second region II, and the third region III.

The first transistor TRA, the second transistor TRB, the third transistor TRC, the fourth transistor TRDc, and the fifth transistor TREc may be respectively disposed in the first region I, the second region II, the third region III, the fourth region IV, and the fifth region V.

The fifth transistor TREc may be formed at a point where the fifth fin-type active region FAE and a fifth gate line GLEc intersect each other. The fifth gate line GLEc may include a fifth lower metal-containing layer M1Ec, a fifth upper metal-containing layer M2Ec, a fifth conductive barrier layer BMEc, and a gap fill metal layer GMc. A height from a lowermost end to an uppermost end of the fifth lower metal-containing layer M1E may be a fifth height HEc.

Heights of the first through fourth gate lines GLA, GLB, GLC, and GLD may have a fourth height HD which is approximately equal. While the fifth gate line GLEc may have approximately a fifth height HEc which is smaller than the fourth height HD which is the height of each of the first through fourth gate lines GLA, GLB, GLC, and GLD, in some embodiments, when the gap fill metal layer GMc has a shape protruding upwards (Z direction), the fifth gate line GLEc may have a height that is smaller than the fourth height HD, but greater than the fifth height HEc.

When the second width WGW (FIG. 4) which is a width of the fifth gate line GLEc is greater than the first width WGN (FIG. 4) which is the width of each of the first through fourth gate lines GLA, GLB, GLC, and GLD, the height of the fifth gate line GLEc may be reduced during the process of forming the first through fifth gate lines GLA, GLB, GLC, GLD, and GLEc.

According to the semiconductor device of the inventive concept, an n-type MOSFET having a relatively low operating voltage, an n-type MOSFET having a relatively high operating voltage, a p-type MOSFET having a relatively high operating voltage, and a p-MOSFET having a relatively low operating voltage may all be implemented.

Further, a p-type MOSFET having a relatively low operating voltage may be implemented without adding a separate step, by using a mask layer used to form a gate line of a transistor having a large channel length.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a substrate having a first region, a second region, and a third region;
   a first fin-type active region protruding from the substrate in the first region and having a first channel region doped with a first conductivity-type impurity, and a first transistor including a first gate line extending in a direction crossing the first fin-type active region, and including a first lower metal-containing layer and a first upper metal-containing layer;
   a second fin-type active region protruding from the substrate in the second region and having a second channel region doped with the first conductivity-type impurity, and a second transistor including a second gate line having a same width as that of the first gate line and extending in a direction crossing the second fin-type active region, and including a second lower metal-containing layer and a second upper metal-containing layer on the second lower metal-containing layer; and
   a third fin-type active region protruding from the substrate in the third region and having a third channel region doped with a second conductivity-type impurity different from the first conductivity type, and a third transistor including a third gate line having a same width as the first gate line and extending in a direction crossing the third fin-type active region, and including a third lower metal-containing layer and a third upper metal-containing layer on the third lower metal-containing layer,
   wherein each of an uppermost end of the first upper metal-containing layer and an uppermost end of the second lower metal-containing layer are located at a higher level than an uppermost end of the first lower metal-containing layer, and
   wherein an uppermost end of the third lower metal-containing layer and the uppermost end of the first lower metal-containing layer are located at a same level, and an uppermost end of the third upper metal-containing layer and the uppermost end of the first upper metal-containing layer are located at a same level.

2. The semiconductor device of claim 1, wherein a level of the uppermost end of the second upper metal-containing layer and a level of the uppermost end of the second lower metal-containing layer are equal.

3. The semiconductor device of claim 1, wherein the first and second lower metal containing layers include a material having a smaller work function than the first and second upper metal-containing layers,
wherein the first upper metal-containing layer and the second upper metal-containing layer include same material.

4. The semiconductor device of claim 1, wherein a cross-section of the first lower metal-containing layer on a plane perpendicular to an extension direction of the first gate line and a cross-section of the second lower metal-containing layer on a plane perpendicular to an extension direction of the second gate line each have a U-shape.

5. The semiconductor device of claim 1, wherein a thickness of the first lower metal-containing layer is less than a thickness of the second lower metal-containing layer.

6. The semiconductor device of claim 1, wherein the first and second transistors are p-type metal oxide semiconductor field effect transistors (MOSFETs), wherein an operating voltage of the second transistor is less than an operating voltage of the first transistor.

7. The semiconductor device of claim 1, wherein the first gate line further includes a first conductive barrier layer on the first upper metal-containing layer,
wherein the third gate line further includes a second conductive barrier layer on the third upper metal-containing layer, the second conductive barrier layer including a same material as the first conductive barrier layer,
wherein an uppermost end of the first conductive barrier layer and an uppermost end of the second conductive barrier layer are located at a same level, and a lowermost end of the first conductive barrier layer is located at a higher level than a lowermost end of the second conductive barrier layer.

8. The semiconductor device of claim 7, wherein the uppermost end of the first conductive barrier layer and the uppermost end of the first upper metal-containing layer are located at a same level.

9. The semiconductor device of claim 1, wherein a height of the second gate line is greater than a height of the first gate line.

10. A semiconductor device comprising:
a substrate having a first region, a second region, and a third region;
a first transistor formed in the first region and including a first gate line including a first lower metal-containing layer and a first upper metal-containing layer on the first lower metal-containing layer;
a second transistor formed in the second region and including a second gate line including a second lower metal-containing layer and a second upper metal-containing layer on the second lower metal-containing layer, the second gate line having a same width as the first gate line; and
a third transistor formed in the third region and including a third gate line including a third lower metal-containing layer and a third upper metal-containing layer on the third lower metal-containing layer, the third gate line having a greater width than the second gate line,
wherein an uppermost end of the first upper metal-containing layer, an uppermost end of the second lower metal-containing layer, and an uppermost end of the third lower metal-containing layer each are located at a higher level than an uppermost end of the first lower metal-containing layer, and
wherein a height of the third gate line is less than a height of the second gate line.

11. The semiconductor device of claim 10, wherein an uppermost end of the second upper metal-containing layer and the uppermost end of the second lower metal-containing layer are located at a same level, and
an uppermost end of the third upper metal-containing layer and the uppermost end of the third lower metal-containing layer are located at a same level.

12. The semiconductor device of claim 10, wherein the first upper metal containing layer, the second upper metal-containing layer, and the third upper metal-containing layer include a same material.

13. The semiconductor device of claim 12, wherein the first lower metal containing layer, the second lower metal-containing layer, the second lower metal-containing layer, and the third lower metal-containing layer include a same material, and
a thickness of the first lower metal-containing layer is less than a thickness of the second lower metal-containing layer.

14. The semiconductor device of claim 10, wherein the first gate line further includes a first conductive barrier layer on the first upper metal-containing layer, and the third gate line further includes a second conductive barrier layer formed on the third upper metal-containing layer and including a same material as the first conductive barrier layer and a gap fill metal layer on the second conductive barrier layer,
wherein an uppermost end of the first conductive barrier layer is located at a higher level than the uppermost end of the first lower metal-containing layer, and
the uppermost end of the second conductive barrier layer is located at a same level as the uppermost end of the third lower metal-containing layer.

* * * * *